United States Patent [19]

Kubota et al.

[11] Patent Number: 5,462,629
[45] Date of Patent: Oct. 31, 1995

[54] SURFACE PROCESSING APPARATUS USING NEUTRAL BEAM

[75] Inventors: Naoki Kubota; Osamu Kinoshita; Yoshio Kaneko, all of Chiba, Japan

[73] Assignee: Kawasaki Steel Corp., Hyogo, Japan

[21] Appl. No.: 111,598

[22] Filed: Aug. 25, 1993

[30] Foreign Application Priority Data

Aug. 28, 1992 [JP] Japan .................................. 4-230033

[51] Int. Cl.$^6$ ........................................................ C23F 1/02
[52] U.S. Cl. ................................................ 156/345; 216/71
[58] Field of Search ............................... 156/637, 639, 156/345, 643, 654

[56] References Cited

U.S. PATENT DOCUMENTS

| | | | |
|---|---|---|---|
| 3,664,747 | 5/1987 | Sekiguchi et al. | 156/643 |
| 3,699,334 | 10/1972 | Cohen et al. | 250/49.5 TE |
| 4,450,031 | 5/1984 | Ono et al. | 156/345 |
| 4,457,803 | 7/1984 | Takigawa | 156/626 |
| 4,487,678 | 12/1984 | Noguchi et al. | 204/298 |
| 4,523,971 | 6/1985 | Cuomo et al. | 156/345 |
| 4,624,214 | 11/1986 | Suzuki et al. | 156/345 |
| 4,758,304 | 7/1988 | McNeil et al. | 156/654 |
| 4,761,199 | 8/1988 | Sato | 156/345 |
| 4,877,479 | 10/1989 | McNeil et al. | 156/654 |
| 5,284,544 | 2/1994 | Mizutani et al. | 156/345 |

FOREIGN PATENT DOCUMENTS 62-259443  11/1987  Japan .
1-120826   5/1989   Japan .

*Primary Examiner*—Olik Chaudhuri
*Assistant Examiner*—Long Pham
*Attorney, Agent, or Firm*—Oliff & Berridge

[57] ABSTRACT

A surface processing apparatus and a dry etching method using a neutral beam. The surface processing apparatus comprises a plasma chamber for generating a plasma P, a neutralizing chamber for converting an ion beam extracted from the plasma P by an ion extracting electrode into the neutral beam, and a processing chamber for introducing therein the neutral beam and etching a substrate S to be processed using the neutral beam. There is also provided a static electric field lens comprising two spaced first electrodes provided on the inner periphery of the neutralizing chamber and a second electrode interposed therebetween so as to obtain the neutral beams having low energy and high flux.

6 Claims, 28 Drawing Sheets

AXIAL DISTRIBUTION

SURFACE PROCESSING APPARATUS USING NEUTRAL BEAM

BACKGROUND OF THE INVENTION

Field of the Invention

The present invention relates, to a surface processing apparatus and a dry etching method using a neutral beam, and particularly to a surface processing apparatus capable of effecting surface processing such as etching on an object to be processed without any damage with high accuracy and to a dry etching method.

There is known a dry etching apparatus capable of bringing a neutral beam into an etchant as one of surface processing apparatuses.

As the dry etching apparatus, there is known one shown in FIG. 30, which has been disclosed in Japanese Patent Application Laid-Open Publication No. 62-259443, for example, wherein a positive ion beam corresponding to the rare gas is extracted into a vacuum chamber 154 by an ion extracting electrode 152 from a plasma generated in an ion source 150 using a d.c. discharge or a high-frequency discharge, the rare-gas ion beam is converted into a rare-gas neutral beam (also hereinafter called a "neutral particle beam") by a resonance charge-exchange reaction between the rare-gas ion and neutral rare gas comprised of elements similar to the rare-gas ions in the vacuum chamber 154, and a substrate S to be processed is irradiated with the neutral beam thereby to etch the substrate S.

A pair of deflecting electrodes 158 is provided in the dry etching apparatus referred to above. Ions produced by the charge-exchange reaction and ions which have been extracted from a plasma source and remain unchanged, are deflected by the deflecting electrodes 158 so that they do not reach the substrate S. Incidentally, reference numeral 156 in the drawing indicates a turbo-molecular pump.

As other dry etching apparatus, there is known one shown in FIG. 31, which has been disclosed in Japanese Patent Application Laid-Open Publication No. 1-120826, for example, wherein negative ions produced by an electron attachment reaction from a plasma generated within a discharge tube 164 using a microwave input from a microwave oscillator 160 through a waveguide 162, are extracted into a vacuum chamber 166 in beam form, a beam of the negative ions is converted into a neutral beam by a charge-exchange reaction, and a substrate S to be processed is irradiated with the neutral beam through grid electrodes 168 thereby to etch the substrate S. Incidentally, reference numeral 170 in the drawing indicates a vacuum pump.

In the disclosed dry etching apparatus, deflecting magnets and the ion retarding electrodes (grid electrodes) 168 are respectively provided in front of the substrate S to be processed in order to prevent electrons and ions from reaching the substrate S.

A demand for uniformly processing the surface of an object to be processed originally exists in each of the surface processing apparatuses which start with the dry etching apparatuses disclosed in the above publications.

However, even in the case of all dry etching apparatuses disclosed in the above-described publications, the ion beam extracted from the plasma is diverged by the coulomb repulsion exerting between respective charged particles in the ion beam while the ion beam is being transported within the vacuum chamber. Therefore, the neutral particle beam produced by converting the ion beam into the neutral beam is also diverged. As a result, uniform processing and high anisotropic processing cannot be effected on the substrate even if the neutral particle beam is caused to reach the substrate according to the degree of divergence of the neutral particle beam. Thus, a fine pattern cannot be etched with high accuracy.

In particular, the ion beam is made more divergent so long as increases in transporting distance and beam flux are made or a reduction in beam energy is made.

Even when, on the other hand, the neutral particle beam is produced by either one of the charge-exchange reaction and the electron attachment reaction, the efficiency of reaction is made high as the relative speed or velocity between respective mutually-reacted particles decreases. Further, the energy (also hereinafter called merely "energy") of translational motion of the ion beam may be set as low as possible to reduce etching damage caused by a collision between an etchant and the substrate.

According to the above construction, the production of the neutral particle beam having the low energy and the high flux and the attainment of the uniform high anisotropic processing are contrary to each other depending on the conventional dry etching apparatuses. Therefore, a problem arises that both the production and the attainment cannot be met simultaneously.

Since the ion beam is always made divergent as described above during transportation, the diverged neutral beam is merely obtained in principle. However, particularly when the ion beam is removed by the deflecting electrodes 158 alone as in the case of the dry etching apparatus shown in FIG. 30, the neutral particles produced by the charge-exchange reaction inherit or take over the direction of the ion beam as it is upon charge exchange. Therefore, when ions each having the moving direction unorthogonal to an object S to be processed are converted into neutral particles while the ion beam is being transported, the converted neutral particles reach unorthogonally to the object S. It is thus impossible to etch a high-precision and fine pattern. Further, surface processing is ununiformly effected along the direction of the surface of the object S, so that the unevenness on processing tends to occur in its surface. It is therefore necessary to equally bring the neutral beam which reaches the object S into alignment using a certain means in order to carry out high-precision and fine etching processing.

In the surface processing apparatus shown in FIG. 31, a plurality of mesh-like ion retarding electrodes (also called "mesh electrodes") 168 are provided in front of the object (substrate) S to be processed. Therefore, the direction of the neutral beam transmitted through the ion retarding electrodes 168 can be restricted to some degree by bringing the positions of fine holes defined in the respective mesh electrodes into substantial alignment and using the ion retarding electrodes 168 as a collimator. Thus, higher-precision and fine etching can be effected on the object S to be processed.

Further, the present applicant has filed U.S. application Ser. No. 07/896,371, now abandoned wherein a micro channel plate is used as the collimator.

When, however, the collimator (ion retarding electrodes) 168 comprised of the plurality of mesh electrodes and the like is used, the neutral beam can pass through the fine holes of the collimator but is cut off or blocked by areas of portions about the holes. Therefore, the surface of the object S corresponding to the portions about the holes is brought into a shadow at which the neutral beam hardly reaches.

Thus, when the etching is effected with the ion retarding electrodes 168 and the like as the collimator in the above surface processing apparatus, higher-precision and fine processing can be carried out. However, each pattern corresponding to each fine hole of the collimator is transferred onto the object S and hence the unevenness is produced upon etching processing, thus the uniform processing cannot be carried out. The unevenness on processing cannot be removed even if the transmission rate of the collimator is raised beyond need. When the direction of the neutral beam is made even, the unevenness is produced even in the case of one ion retarding electrode.

In the surface processing apparatuses shown in FIGS. 30 and 31 for irradiating the object S with the neutral beam using the ion deflecting electrodes 158 or the ion retarding electrodes 168, when the object S to be processed is replaced by another to effect the next process, it is necessary to stop the irradiation of the object S with the neutral beam for each processing and replace the object S with another. To stop the irradiation of the object S with the neutral beam, it is only necessary to stop the ion beam. As ion-beam stopping methods, there are known one (1) for stopping the generation of a plasma serving as an ion beam source, one (2) for stopping the supply of a voltage to the ion extracting electrode 152, and one (3) for disposing a shutter used for shielding the ion beam during the transportation of the ion beam.

In the method (1), however, the matching between a power source for generating the plasma and the produced plasma is made for each processing. Therefore, a long period of time is required until the plasma is made stable. Therefore a throughput for processing is reduced. Further, the condition of generation of the plasma for each processing varies and there is a potential problem that stable processing conditions cannot be obtained.

In the method (2), the following problem arises. When the ion beam is being extracted from the plasma by the ion extracting electrode 152, a portion of the ion beam collides with the ion extracting electrode 152 thereby to raise the temperature thereof and allow a variation in shape such as a warp to occur in the ion extracting electrode 152. Since, however, the ion extracting electrode 152 takes a stable form at a certain position, an ion beam having quality corresponding to the form of the ion extracting electrode 152 is produced. Thus, when the application of the voltage to the ion extracting electrode 152 is stopped for each processing, the stable ion beam cannot be obtained, thus causing a problem that the uniform processing cannot be effected for each object S to be processed.

In the method (3), it is unnecessary to stop the generation of the plasma and the extracting of the ion beam for each processing. Therefore, this method is excellent in terms of the stability of quality of the ion beam as compared with the above two methods. However, sputtering occurs due to the irradiation of the shutter with the ion beam, so that the dry etching apparatus is filled with materials of the shutter as fine particles. Therefore, a clean process for the object S to be processed is prevented by such fine particles. Further, in the surface processing apparatus shown in FIG. 31, since the ion beam does not reach the ion retarding electrodes 168, a thermal variation in shape occurs in each of the ion retarding electrodes 168 similarly to the ion extracting electrode. Therefore, conditions for allowing the neutral beam to pass through the ion retarding electrodes 168 vary for each processing.

Thus, each of the methods of (1) through (3) is accompanied by a problem that the uniform processing cannot be effected on the object to be processed for each processing.

SUMMARY OF THE INVENTION

The present invention has been made to solve the foregoing problems. Therefore, a first object of the present invention is to provide a surface processing apparatus capable of uniformly effecting surface processing such as high anisotropic etching using a neutral particle beam having low energy and high flux.

A second object of the present invention is to provide a surface processing apparatus capable of effecting uniform processing along the transverse direction of a processing surface on an object to be processed with high accuracy by making use of a neutral beam.

A third object of the present invention is to provide a surface processing apparatus capable of effecting uniform processing under clean environment without a reduction in a throughput for processing each time an object to be processed is replaced.

A fourth object of the present invention is to provide a dry etching method capable of carrying out uniform and high anisotropic etching.

In order to achieve the above first object, there is provided an apparatus for converting an ion beam extracted from a plasma into a neutral beam and processing the surface of an object to be processed using the converted neutral beam, characterized in that at least one of a static electric field lens and a magnetostatic field lens is provided one or two or more within a space for converting the ion beam into the neutral beam.

In order to achieve the above second object, there is provided an apparatus for converting an ion beam extracted from a plasma into a neutral beam and processing the surface of an object to be processed which is attached to a holder, using the converted neutral beam, characterized in that the holder can be moved in at least one of directions parallel and orthogonal to the surface of the object.

In the above-described surface processing apparatus, the displacement of the holder in the direction parallel to the surface of the object to be processed can be at least one of coaxial rotation, eccentric rotation and linear movement.

Similarly, in order to achieve the above second object, there is provided an apparatus for converting an ion beam extracted from a plasma into a neutral beam, allowing the neutral beam to pass through mesh-shaped ion repulsion electrodes or a collimator and irradiating an object to be processed attached to a holder with the neutral beam thereby to process the surface of the object, characterized in that the ion retarding electrodes or the collimator can be displaced in a direction perpendicular to beam axis direction.

In the above-described surface processing apparatus, the displacement of either the ion retarding electrodes or the collimator can be at least one of the coaxial rotation, the eccentric rotation and the linear movement.

In the above-described surface processing apparatus as well, the holder can be moved in a direction parallel to the surface of the object.

In order to achieve the above third object, there is provided an apparatus for converting an ion beam extracted from a plasma into a neutral beam, allowing the neutral beam to pass through an ion removal electrode and irradiating an object to be processed attached to a holder with the neutral beam thereby to process the surface of the object, characterized in that at least one shutter for blocking the neutral beam is disposed between the ion removal electrode and the holder.

In any one of the surface processing apparatuses referred to above, there can be provided a velocity controlling means for accelerating or decelerating the ion beam.

In any one of the above-described surface processing apparatuses as well, there can be provided an exciting means for exciting the neutral beam.

Further, in any one of the surface processing apparatuses, there can be provided a temperature controlling means for controlling the temperature of the object to be processed.

In order to achieve the above fourth object, there is provided a dry etching method comprising the steps of:

generating a plasma;

extracting an ion beam from the plasma;

converting the ion beam into a neutral beam having low energy and high flux using at least one of static electric field lens and a magnetostatic field lens while the ion beam is being prevented from diverging; and etching the surface of an object to be processed using. the neutral beam.

In the dry etching method referred to above, the ion beam can be accelerated or decelerated by a velocity control electrode.

In the dry etching method as well, the neutral beam can be excited by an exciting means.

According to the present invention, since at least one of the static electric field lens and the magnetostatic field lens is provided within the space for neutralizing the ion beam taken out of the plasma, the ion beam transported through the space can be prevented from diverging even if it is low in energy and high in flux. Therefore, the neutral particle beam produced by converting the ion beam into the neutral beam can also be prevented from diverging. As a result, uniform and high anisotropic surface processing can be carried out using the neutral particle beam having the low energy and the high flux.

Further, when at least one of the static electric field lens and the magnetostatic field lens is provided in plural form, the ion beam can be prevented from diverging and at the same time the energy can be controlled upon reaction for conversion of the ion beam into the neutral beam in accordance with charge exchange or electron attachment or the like. It is thus possible to improve the efficiency of neutralization of the ion beam and produce the neutral beam having low energy and high flux, which is free of the divergence and whose direction is made even. Therefore, surface processing, which is high in anisotropy and low in damage, can be achieved at high speed.

According to the present invention as well, the holder can be moved in at least one of the directions parallel and orthogonal to the surface of the object to be processed. Therefore, the object can be displaced in the direction parallel to its surface even where the unevenness on processing appears on the surface of the object due to the fact that, for example, the shadow of each mesh-like ion retarding electrode or the collimator is formed onto the surface of the object according to an improvement in the directivity of the neutral beam. It is thus possible to prevent the unevenness from occurring and effect the uniform processing over the overall surface of the object.

In this case, the unevenness on processing can be reliably prevented from occurring by setting the displacement of the holder in the direction parallel to the surface of the object to at least one of the coaxial rotation, the eccentric rotation and the linear movement.

By enabling the holder to be moved in the direction normal to the surface of the object, the distance between the ion retarding electrodes or the collimator and the object can be suitably adjusted according to the degree of divergence of the neutral beam which has passed through the ion retarding electrodes or the collimator, for example. It is therefore possible to effect the uniform processing over the entire surface of the object.

Further, since the ion retarding electrodes or the collimator is movable in the direction parallel to the surface of the object in the present invention, the distribution of each angle at which the neutral beam falls on the object to be processed is restricted. Therefore, even if the unevenness on processing is produced due to the fact that the shadow of each ion retarding electrode or the collimator appears on the surface of the object, the unevenness on processing can be prevented from occurring and the uniform processing can be effected over the entire surface of the object by moving the ion retarding electrodes or the collimator.

At this time, the unevenness on processing can be reliably prevented from occurring by setting the displacement of the ion retarding electrodes or the collimator to at least one of the coaxial rotation, the eccentric rotation and the linear movement.

Since the holder can be moved in the direction parallel to the surface of the object simultaneously with the displacement of the ion retarding electrodes or the collimator, the unevenness on processing can be more reliably prevented from occurring.

In the present invention, since the shutter for cutting off or blocking the neutral beam is provided between the ion removal electrode and the holder, the shutter can reliably effect the prevention of the object to be processed from being irradiated with the neutral beam. Therefore, the processed object can be replaced by a new object to be processed without stopping the generation of the plasma and the supply of the voltage to the ion extracting electrode. As a result, the next object can be processed under stable operating conditions, thereby making it possible to effect uniform processing on the object to be processed.

Since the shutter is provided behind the ion removal electrode (for example, the ion retarding electrodes, the ion deflecting electrode, etc.), the shutter is not irradiated with the ion beam but with neutral beam alone. Since the neutral beam is normally low in sputtering yield with respect to the same material as compared with the ion beam, the provision of the shutter behind the ion removal electrode enables the inside of the surface processing apparatus to be maintained at a clean state as compared with the provision of the shutter in front of the ion removal electrode, i.e., in the course of the transportation of the ion beam.

Even when the ion retarding electrodes are used as an alternative to the ion removal electrode, operating conditions between a plasma chamber and the ion retarding electrodes can be kept constant. Therefore, a thermal variation can be prevented from occurring in the ion retarding electrodes. In the same manner as described above, the next processing can be stably effected under predetermined conditions.

Thus, the object can be processed under the clean environment of apparatus and the stable operating conditions without a reduction in throughput by disposing the shutter between the ion removal electrode and the holder. It is therefore possible to effect the uniform processing on the object for each processing.

According to the present invention, when there is provided the velocity controlling means for accelerating or decelerating the ion beam, the energy of translational motion of the ion beam can be controlled. Thus, the efficiency of the charge-exchange reaction can be improved and the produced neutral beam can be controlled to a translational velocity most suitable for high anisotropic etching, for example.

When, for example, the velocity controlling means for accelerating or decelerating the ion beam is attached to the surface processing apparatus provided with the static electric field lens or the magnetostatic field lens for controlling the divergence of the ion beam, the efficiency of conversion of the ion beam into the neutral beam can be improved and the energy of translational motion of the produced neutral beam can be suitably adjusted. It is therefore possible to effect, at high speed, uniform surface processing having high anisotropy and capable of providing low damage.

When the exciting means for exciting the neutral beam is provided in the present invention, the neutral beam can be brought into a chemically active state. It is therefore possible to make a further improvement in etching speed, for example.

When the temperature controlling means for controlling the temperature of the object to be processed is provided in the present invention, the object can be set to a desired processing temperature and the entirety of the object can be maintained at the same temperature. It is therefore possible to reliably effect uniform processing on the entire surface of the object.

In the present invention, a plasma is first generated to draw an ion beam therefrom. The ion beam is then converted into a neutral beam having low energy and high flux using at least one of a static electric field lens and a magnetostatic field lens while the ion beam is being prevented from diverging. Thereafter, the surface of an object to be processed is etched using the neutral beam. It is thus possible to carry out uniform and high anisotropic dry etching.

According to the present invention, since the ion beam extracted from the plasma can be prevented from diverging using at least one of the static electric field lens and the magnetostatic field lens, the uniform surface processing such as high anisotropic etching or the like can be achieved.

When each lens referred to above is provided in the form of plural stages, beam energy can be controlled upon reaction for neutralization of the ion beam. Therefore, the neutral beam can be produced at high conversion efficiency and can be obtained with low energy. It is thus possible to achieve surface processing such as etching capable of providing low damage and having high anisotropy.

According to the present invention as well, when the object to be processed is irradiated with the neutral beam produced by conversion from the ion beam, the holder having the object to be processed which is attached thereto is provided with the movements in the direction parallel to the processing surface of the object, such as the rotation, the linear displacement, etc. Therefore, the unevenness on the object, which is produced with an improvement in directivity of the neutral beam, can be removed. As a result, the uniform processing can be effected on the overall object to be processed.

Further, according to the present invention, when the neutral beam obtained by conversion from the ion beam is allowed to pass through the ion retarding electrodes or the collimator and the object to be processed is irradiated with the neutral beam, the ion retarding electrodes or the collimator is provided with the movements in the direction parallel to the processing surface of the object, such as the rotation, etc. Therefore, the unevenness on the object, which is produced with an improvement in directivity of the neutral beam, can be removed, thereby making it possible to effect uniform processing on the entirety of the object in the same manner as described above.

Moreover, according to the present invention, since the shutter for cutting off or blocking the neutral beam is provided between the ion retarding electrodes and the object to be processed, the object can be replaced by another without stopping the operation of the surface processing apparatus. Therefore, the plasma source, the ion beam extracting electrode and the ion retarding electrodes or the like can be maintained at a constant state for each processing.

Thus, since the stable ion beam and neutral beam can be produced at all times and processing conditions can be prevented from varying for each object to be processed, uniform processing can be effected on the object and the amount of sputtering of the shutter can be reduced as compared with the case where the ion beam is blocked by the shutter. It is therefore possible to maintain the inside of the surface processing apparatus at a clean state.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The preferred embodiments will be described with reference to the drawing, wherein like elements have been denoted throughout the figures with like reference numerals, and wherein.

DETAILED DESCRIPTION OF THE PREFERRED EMBODIMENTS

Preferred embodiments of the present invention will hereinafter be described in detail with reference to the accompanying drawings.

Figure 1:
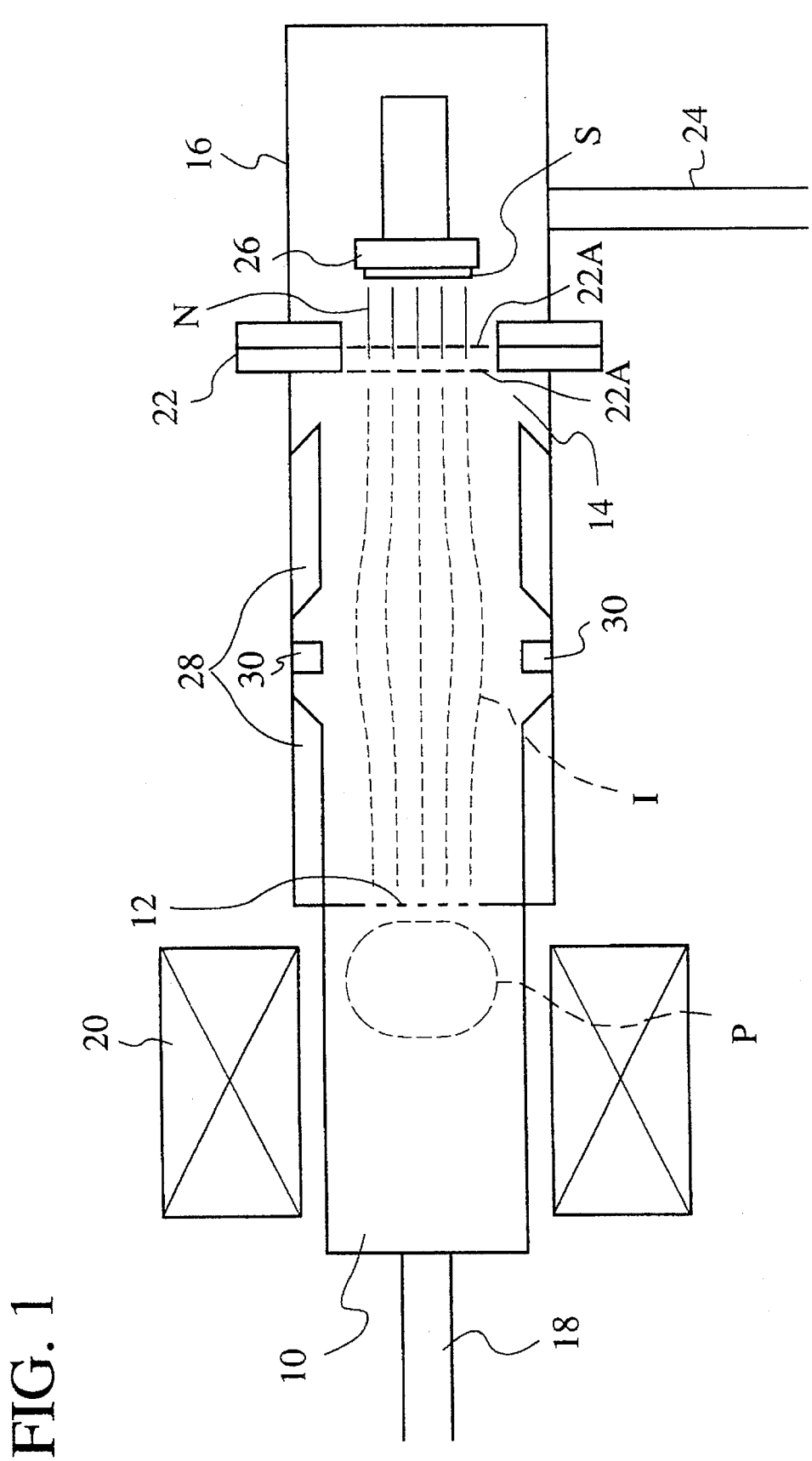
FIG. 1 is a cross-sectional view schematically showing a dry etching apparatus according to a first embodiment of the present invention.

FIG. 1 is a schematic sectional view showing a dry etching apparatus according to a first embodiment of the present invention. The dry etching apparatus according to the present embodiment comprises a plasma chamber 10 for generating a plasma P, a neutralizing chamber 14 for converting an ion beam I produced or extracted from the plasma P by an ion extracting electrode 12 into a neutral beam N, and a processing chamber 16 for introducing therein the neutral beam N produced in the neutralizing chamber 14 and processing the surface of an object S to be processed with the neutral beam N.

In order to produce a plasma in accordance with the electron cyclotron resonance (ECR), a waveguide 18 for introducing a microwave from a microwave source (not shown) is coupled to the plasma chamber 10. A electromagnet 20 for the ECR is disposed around the plasma chamber 10. Also coupled to the plasma chamber 10 are a gas introduction line (not shown) for introducing a raw gas and a vacuum evacuating device for bringing the inside of the plasma chamber 10 into desired reduced pressure.

The ion extracting electrode 12 is electrically connected to an unillustrated power source and supplied with a negative potential lower than the potential of the plasma P to extract or produce positive ions from the plasma P generated within the plasma chamber 10. While, the plasma chamber 10 is grounded, or is supplied with positive potential. The ion energy is controlled by the potential of the plasma chamber 10 and that of the ion extracting electrode 12.

The ion retarding electrodes 22 for preventing the ions which have passed or generated within the neutralizing chamber 14 from being introduced into the processing chamber 16, are provided between the neutralizing chamber 14 and the processing chamber 16. Only the neutral beam and thermally-motional neutral particles are introduced into the processing chamber 16.

Figure 31:
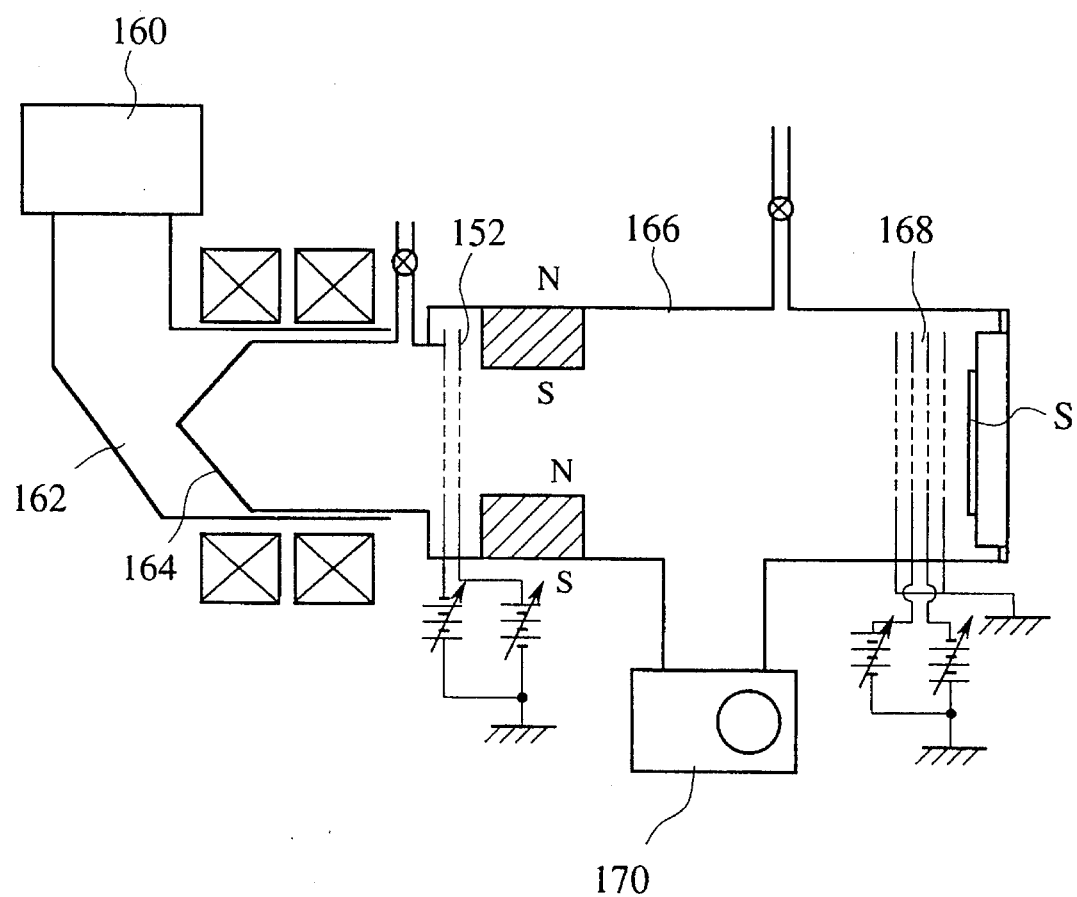
FIG. 31 is a cross-sectional view schematically showing another example of the conventional neutral-beam etching apparatus.

The ion retarding electrodes 22 are formed by superposing two perforated plates 22A having holes regularly defined therein on each other with a given interval, e.g., an interval of 2 mm left therebetween. The ion retarding electrodes 22 also serve as a collimator. Thus, the divergency of the neutral beam can be further reduced as compared with the case where mesh electrodes are used as shown in FIG. 31.

A vacuum exhaust tube 24 coupled to a vacuum exhausting device (not shown) is coupled to the processing chamber 16 so that the pressure in the processing chamber 16 can be adjusted. A holder 26 for mounting a substrate S (object to be processed) is provided within the processing chamber 16.

Figure 2:
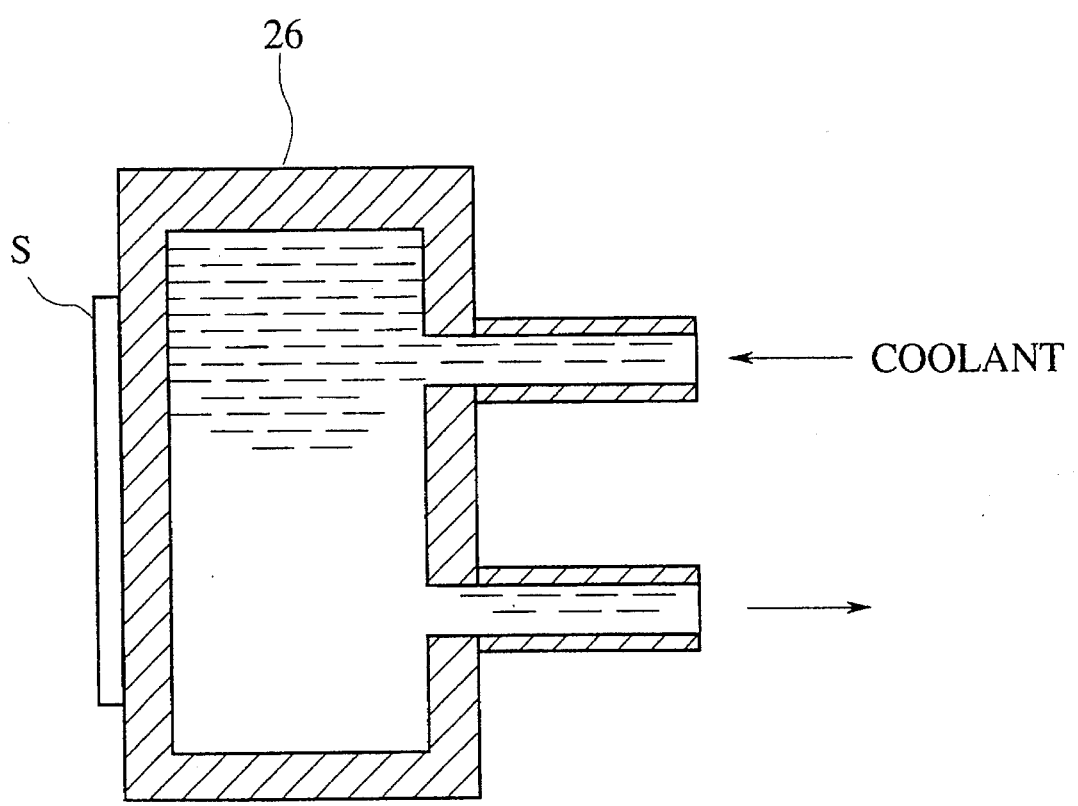
FIG. 2 is an enlarged cross-sectional view for describing a function for controlling the temperature of an object to be processed, which has been attached to a holder.

The holder 26 has a function for controlling the temperature of the substrate S. Described specifically, the temperature of the substrate S can be controlled by circulating a coolant in the holder 26 as represented by an enlarged cross-section of FIG. 2.

In the present embodiment, two spaced first electrodes 28 and a second electrode 30 interposed therebetween are both provided on the inner periphery of the neutralizing chamber 14 in the form of rings. The two first electrodes 28 are grounded and the second electrode 30 interposed therebetween is supplied with a positive potential. A static electric field lens is made up of the two first electrodes 28 and the second electrode 30.

In the present embodiment, there is provided the static electric field lens comprised of a combination of the first electrodes 28 and the second electrode 30 as described above. Therefore, when the ion beam I is extracted from the plasma P produced in the plasma chamber 10 by the ion extracting electrode 12 so as to enter into the neutralizing chamber 14, the ion beam I can be prevented from diverging as indicated by the broken lines in the drawing.

Figure 3:
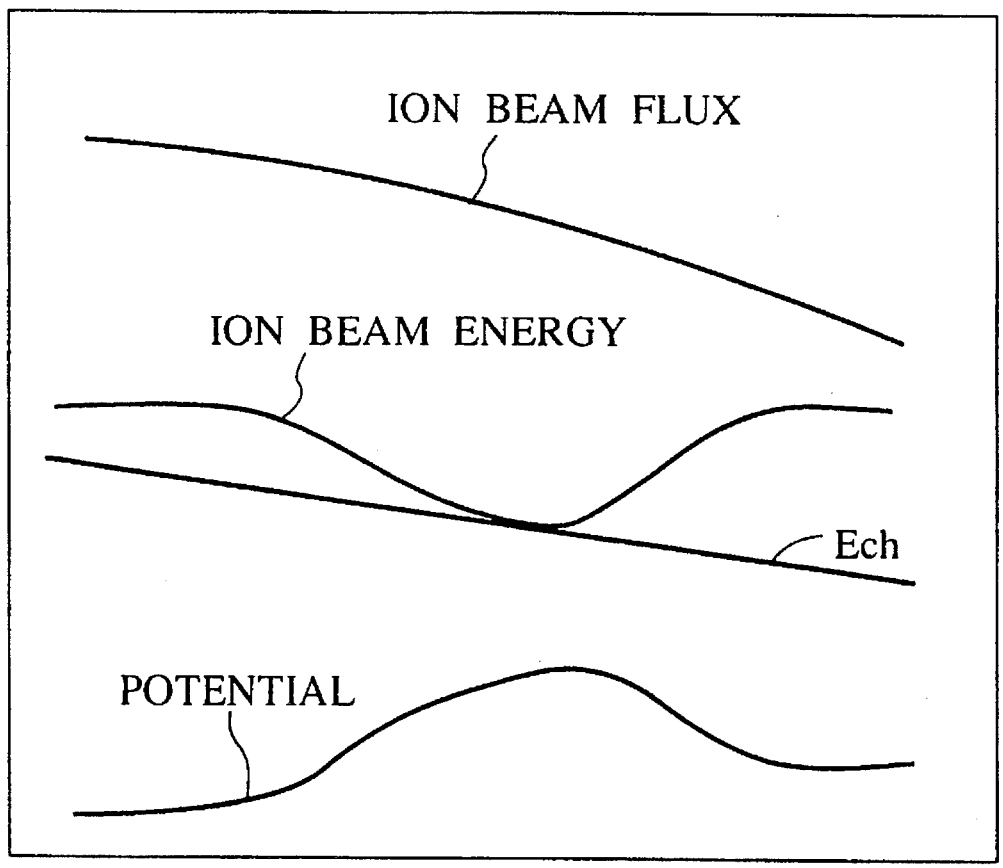
FIG. 3 is a diagrammatic view for explaining the operation of the dry etching apparatus shown in FIG. 1.

FIG. 3 is a diagrammatical view showing an axial distribution of each of an electrostatic potential, an ion beam energy and an ion beam flux produced in the neutralizing chamber 14 during etching. Now, consider where ions are neutralized by charge-exchange reaction. It has been already known that the lower the energy is set, the higher the efficiency of charge exchange is given. Since, however, a beam diverges due to the coulomb repulsion exerted between the ions, the beam energy, which can be set, has the lower-limit value Ech. As is apparent from the drawing, the ion beam flux decreases as the ion beam converts into the neutral beam. Correspondingly, the lower-limit beam energy Ech is also reduced. The ion beam energy is controlled so as to be maintained at the lowest level not less than the lower-limit beam energy Ech.

Since only one static electric field lens is employed in the dry etching apparatus, a distribution curve of the ion beam energy is formed so as to have a minimum value due to a potential produced by the static electric field lens. And the efficiency of charge exchange is maximized at the region where the ion beam energy have the minimum value.

According to the present embodiment, as described above, the ion beam can be prevented from being diverged within the neutralizing chamber 14. Thus, the produced neutral beam can also be prevented from being moved in different directions. Further, the ion retarding electrodes 22 enable the prevention of ions and electrons from being introduced into the processing chamber 16. Therefore, only a neutral particle beam N can be introduced into the processing chamber 16 and the substrate S attached to the holder 26 can be etched by the neutral particle beam N. Thus, since the substrate S can be etched by the neutral particle beam N which is of the same direction and has low energy, etching which is high in anisotropy and low in damage, can be uniformly effected on the substrate S.

Further, since the temperature of the substrate S can be controlled as described above, for example, chemically-active radical reaction can be controlled. Described specifically, the isotropic etching attributable to the radical can be controlled by introducing a coolant such as liquid nitrogen into the holder 26 and setting the temperature of the substrate S to about −100° C. As a result, etching, which has higher anisotropy, can be achieved.

Figure 4:
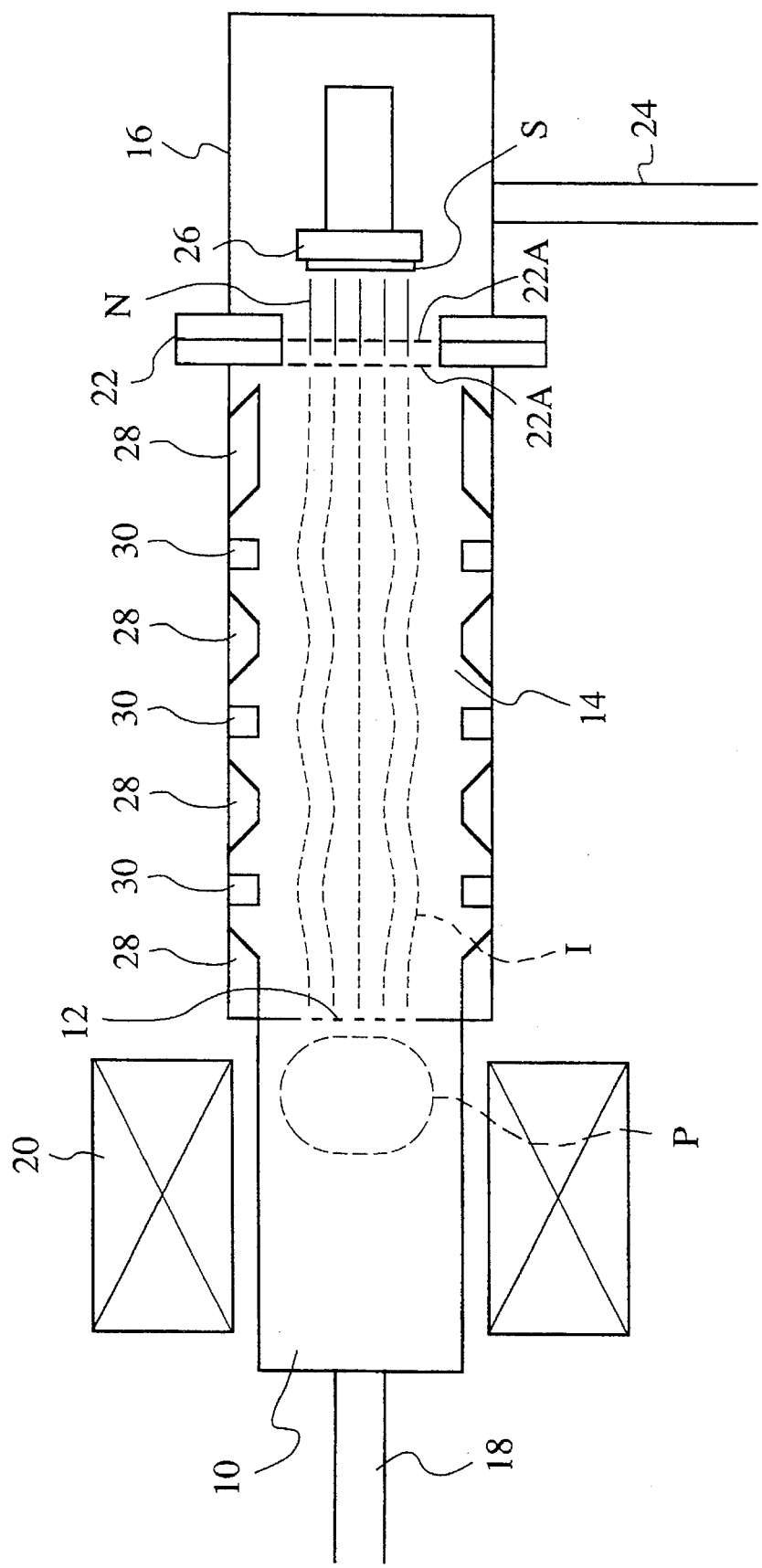
FIG. 4 is a cross-sectional view schematically showing a dry etching apparatus according to a second embodiment of the present invention.

FIG. 4 is a cross-sectional view showing a dry etching apparatus according to a second embodiment of the present invention and corresponding to FIG. 1.

In the dry etching apparatus according to the present embodiment, four first electrodes 28 spaced away from each other and three second electrodes 30 provided between the respective adjacent first electrodes 28 are disposed on the inner periphery of a neutralizing chamber 14. The dry etching apparatus is substantially identical in structure to that according to the first embodiment except that three lenses are disposed in total in accordance with combinations of these first and second electrodes 28 and 30.

Figure 5:
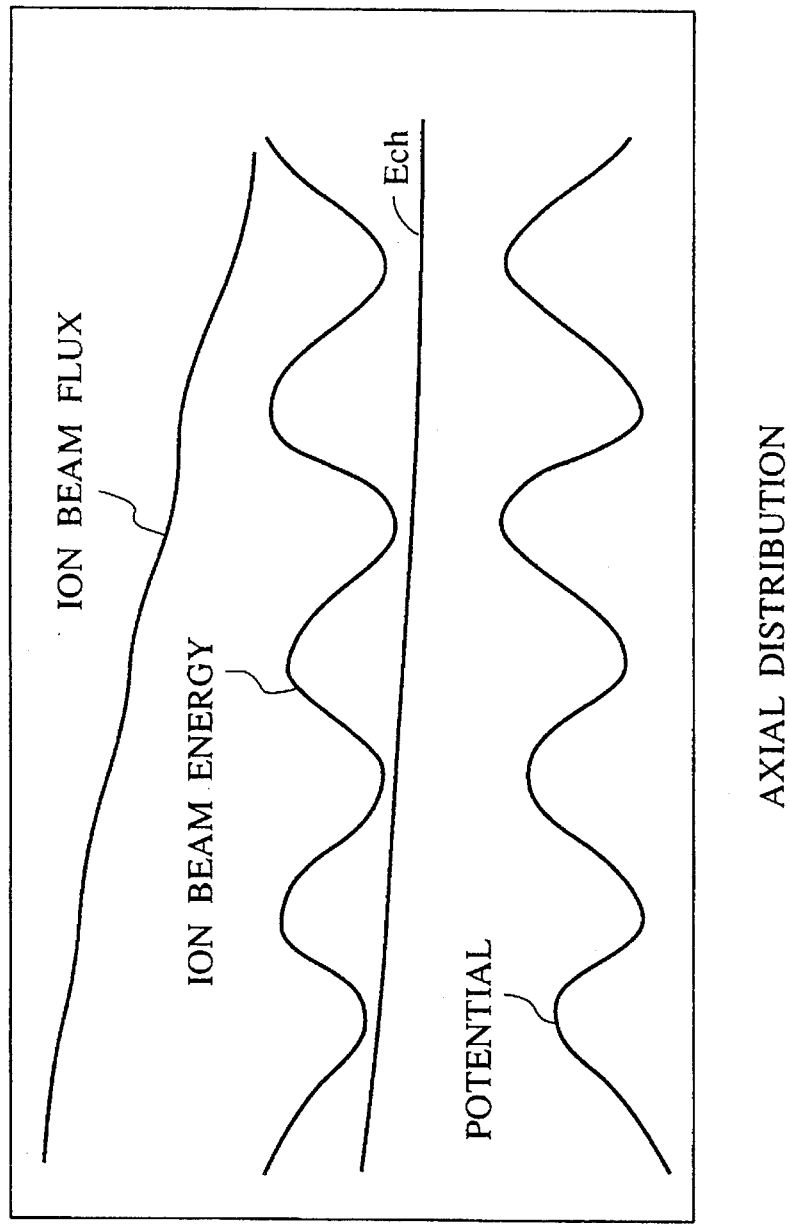
FIG. 5 is a diagrammatic view for explaining the operation of the dry etching apparatus shown in FIG. 4.

FIG. 5 is a diagrammatical view showing an axial distribution of each of an electrostatic potential, ion beam energy and an ion beam flux produced in the neutralizing chamber 14 employed in the present embodiment and corresponding to FIG. 3. As is apparent from the comparison between FIG. 5 and FIG. 3, the dry etching apparatus differs from that according to the first embodiment in that the number of times at which the beam energy in the neutralizing chamber 14 takes a given value is greater than that taken by the dry etching apparatus according to the first embodiment, and the average value of the beam energy can be changed by varying the potential supplied to each static electric field lens.

So, the dry etching apparatus according to the present embodiment can make the charge-exchange reaction at efficiency higher than that obtained by the dry etching apparatus according to the first embodiment. In practice, the present embodiment could obtain the charge-exchange reaction at efficiency of about 3 times that obtained by the first embodiment.

According to the present embodiment, as described above in detail, similarly to the first embodiment, the ion beam produced or extracted from the plasma can be prevented from diverging. Further, a neutral particle beam produced by neutralizing the ion beam can also prevented from diverging. It is therefore possible to achieve high anisotropic etching processing.

According to the present embodiment as well, there are provided a plurality of stages of static electric field lenses. Therefore, the ion beam can be adjusted so as to have energy suitable for production of chemical reactions such as the charge-exchange reaction, etc., for converting the ion beam into the neutral beam. It is thus possible to produce the exchange reaction at high efficiency.

A description will next be made of the result of actual etching of a polysilicon (poly/Si) layer deposited on a silicon substrate by the dry etching apparatus according to the present embodiment.

In the plasma chamber 10, chlorine ($Cl_2$) is first brought into plasma. Then, an ion beam composed of $Cl^+$ and $Cl_2^+$ is extracted from the produced plasma so as to be introduced into the neutralizing chamber 14. Similarly, the ion beam is neutralized with the $Cl_2$ (target gas) to produce a neutral beam. When the polysilicon layer on the silicon substrate attached to the holder 26 was etched by the neutral beam, a sufficient practical etching velocity. 500 Å/min was obtained. At the same time, the ion beam before the execution of the charge exchange could be transported in parallel without diverging. Therefore, a neutral particle beam whose direction has been made even, could be produced. It was thus possible to allow the neutral particle beam to vertically enter into the silicon substrate. As a result, high anisotropic etching sufficiently practical in fine processing of 0.5 μm rule could be achieved.

Figure 6:
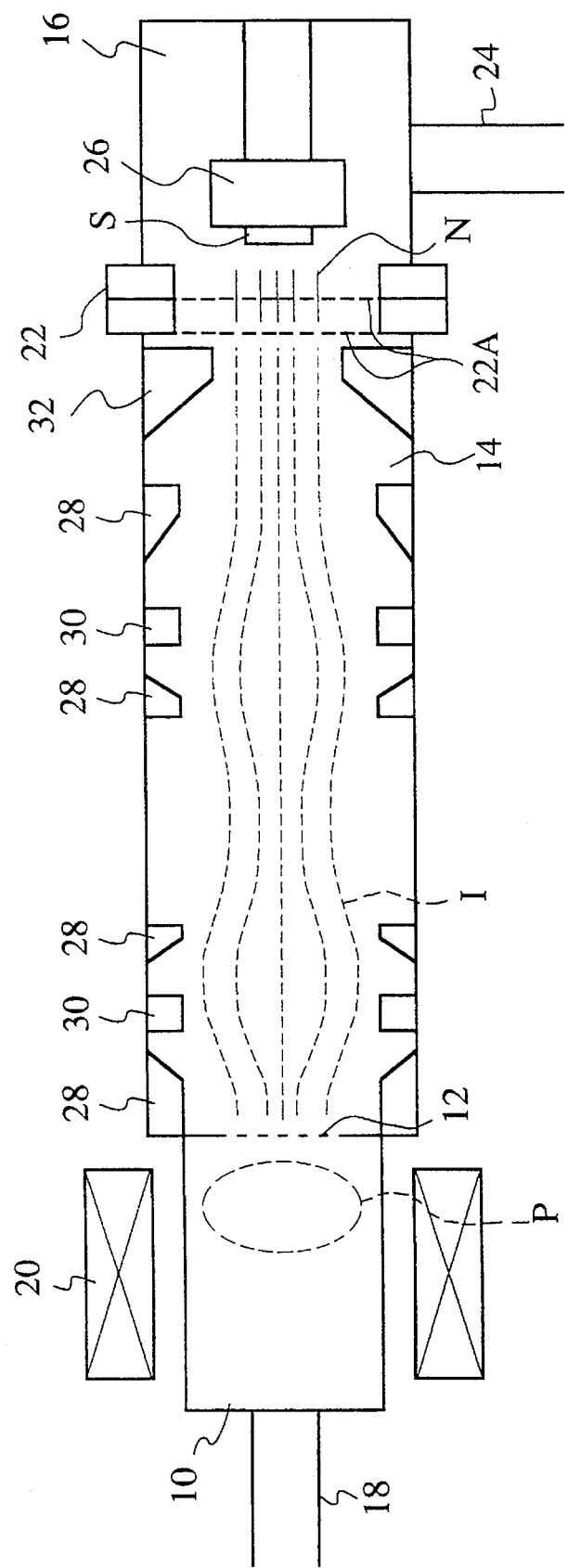
FIG. 6 is a cross-sectional view schematically illustrating a dry etching apparatus according to a third embodiment of the present invention.

FIG. 6 is a cross-sectional view showing a dry etching apparatus according to a third embodiment of the present invention and corresponding to FIG. 1.

The dry etching apparatus according to the present embodiment is substantially identical in structure to that shown in FIG. 1 according to the first embodiment except that two static electric field lenses each comprising two first electrodes 28 and a second electrode 30 interposed therebetween are provided on the inner periphery of a neutralizing chamber 14 and a ring-shaped velocity control electrode 32 for accelerating or decelerating an ion beam is provided at a position adjacent to ion retarding electrodes 22.

In the present embodiment, each static electric field lens enables the prevention of the ion beam from diverging in a manner similar to the dry etching apparatus according to each of the first and second embodiments, and the direction of the ion beam can be arranged in parallel. At the same time the ion beam can be adjusted to desired energy (velocity) since the velocity control electrode 32 is disposed.

Figure 7:
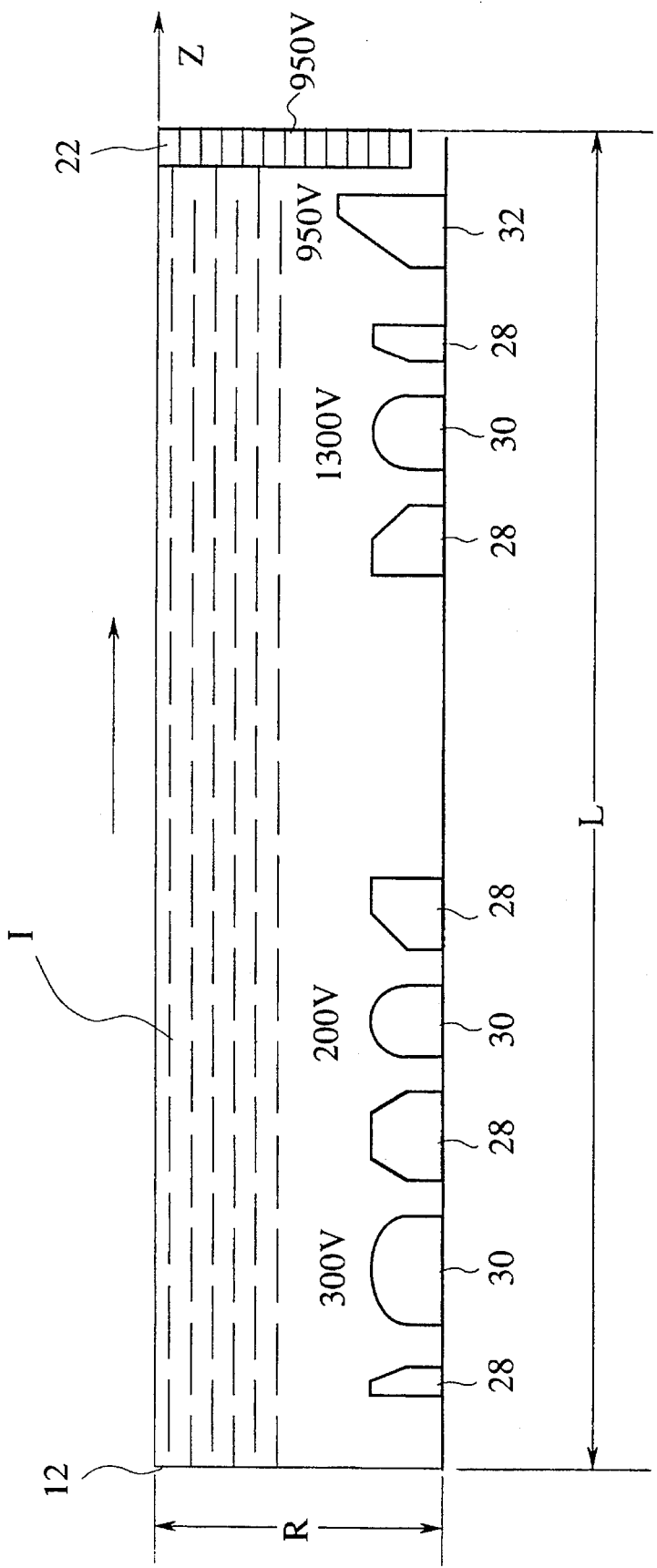
FIG. 7 is a view for describing one example of the manner of voltages supplied to respective electrodes used when an ion beam is controlled.

A specific description will now be made of the deceleration of the ion beam with reference to FIG. 7. FIG. 7 shows a semi-section (lower side) extending in the radius direction at the time that the center of the cylindrical neutralizing chamber 14 having a radius of R and a length of L is defined as a Z-axis. The ion extracting electrode 12 is disposed in the position on the left-end side, whereas the ion retarding electrodes 22 are provided at the position on the right-end side. Here, the dry etching apparatus using a radius of R=0.08 m and a length of L=0.38 m is used. It is however needless to say that the dry etching apparatus is not necessarily limited to these dimensions.

Figure 8:
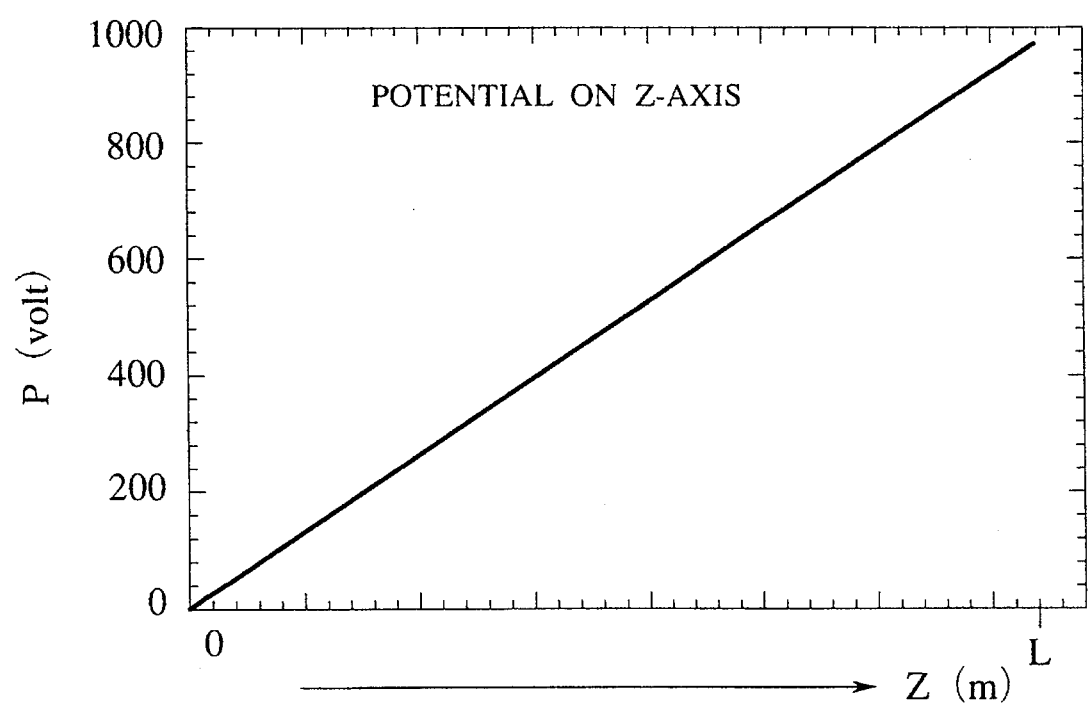
FIG. 8 is a diagrammatic view for explaining a potential gradient on a Z axis shown in FIG. 7.

The ion extracting electrode 12 is grounded and each of the ion retarding electrodes 22 is supplied with a positive voltage of 950 V. The initial ion beam energy is about 950 V. An equipotential surface (not shown) having a gradient shown in FIG. 8 and perpendicular to the Z-axis is extending along a Z-axis direction. The first electrodes 28 of the static electric field lenses (three pairs of static electric field lenses for convenience of illustration in the present embodiment) are all grounded. Further, respective voltages of 300 V, 200 V and 1300 V are supplied to their corresponding second electrodes 30 as seen from the side near the ion extracting electrode 12 thereby to make positive ions extracted by the ion extracting electrode 12 parallel to the Z-axis. Furthermore, a voltage of 950 V is supplied to the velocity control electrode 32 so as to reduce the velocity of a positive ion beam.

The voltages supplied to their corresponding electrodes are not fixed and set to the most suitable voltages in such a manner that the direction of the ion beam is made even or parallel and the ion beam is moved at a suitable velocity. When it is desired to accelerate the ion beam, a voltage opposite to that employed upon the deceleration of the ion beam is supplied to the velocity control electrode 32.

Figure 9:
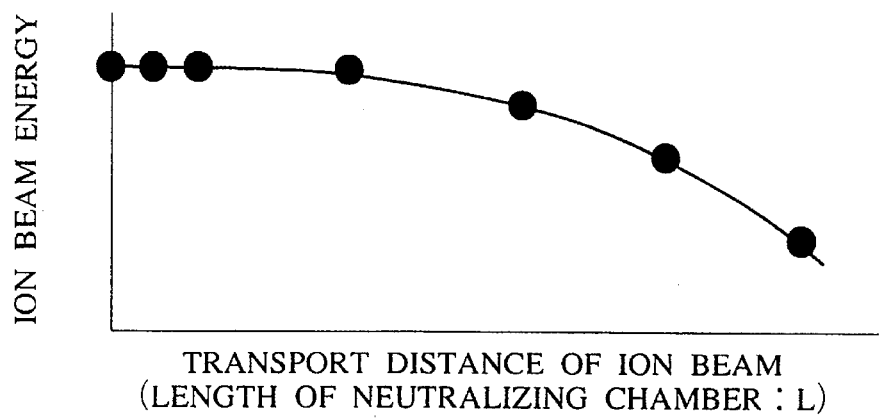
FIG. 9 is a diagrammatic view for describing the energy of an ion beam at the time that the ion beam has been decelerated by a velocity control electrode.
Figure 10:
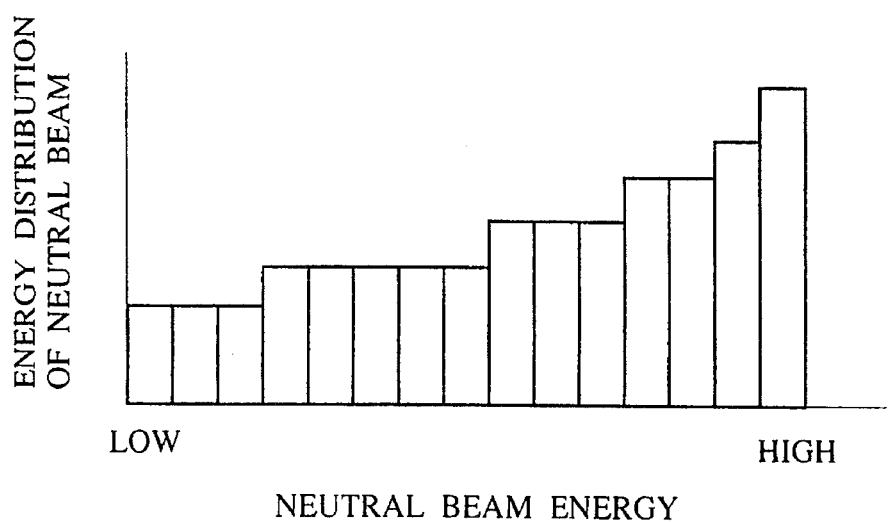
FIG. 10 is a graph for describing the distribution of energy of a neutral beam at the time that an ion beam has been decelerated.
Figure 11:
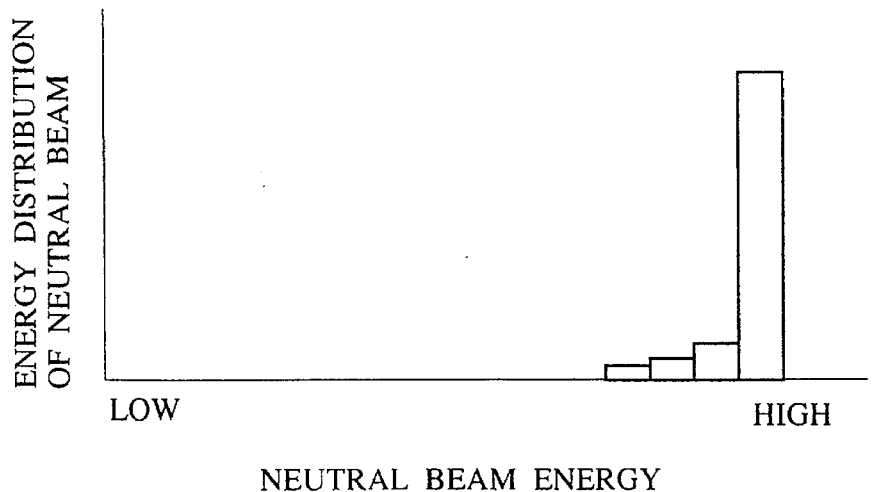
FIG. 11 is a graph for describing the distribution of energy of the neutral beam at the time that the ion beam has not been decelerated.

FIG. 9 shows the energy of the ion beam with respect to the transport distance of the ion beam, i.e., the length L extending from the ion extracting electrode 12, of the neutralizing chamber 14 at the time that the positive voltage has been supplied to the velocity control electrode 32 and the ion beam has been decelerated. FIG. 10 illustrates an energy distribution of a neutral beam produced by the charge-exchange reaction when the ion beam has been decelerated. For comparison with FIG. 10, FIG. 11 depicts an energy distribution of the neutral beam at the time that the velocity control electrode 32 is not used.

As is apparent from FIG. 9, the longer the transport distant is set, the less the energy (velocity) of the ion beam is made. As is apparent from the comparison between FIG. 10 and FIG. 11, low energy components can be produced into the neutral beam by decelerating the ion beam with the velocity control electrode 32, with the result that high energy components can be effectively reduced. It is therefore possible to reduce damage given to the substrate S when etched. Since the velocity of the ion beam is reduced, the efficiency of conversion of the ion beam into the neutral beam is also improved. Since, however, the mere deceleration of the ion beam causes an increase in divergence of the ion beam and the neutral beam, it is necessary to optimize operating conditions of the two lenses according to a variation in the velocity of the ion beam.

On the other hand, a reduction in the energy of the ion beam at the time of its extracting and the acceleration of the ion beam in the neutralizing chamber are also effective for the reduction in the high energy components of the neutral beam.

Figure 12:
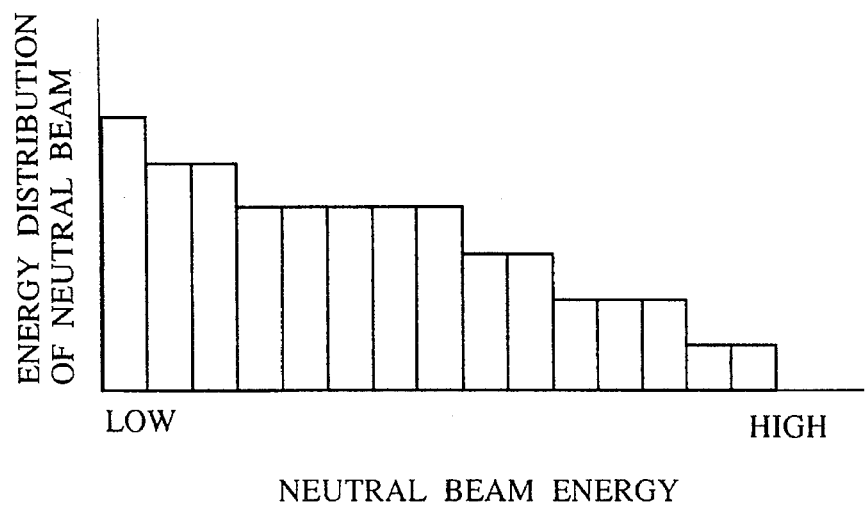
FIG. 12 is a graph for describing the distribution of energy of the neutral beam at the time that the ion beam has been accelerated.

FIG. 12 shows an energy distribution of the neutral beam at the time of acceleration of the ion beam. As is apparent from the comparison between FIG. 12 and FIG. 10, the high energy components of the produced neutral beam can be further reduced by accelerating the ion beam. This is because since the neutralization efficiency is high so long as the ion beam is brought to low energy, the neutralization of the ion beam proceeds while the ion beam is in low energy. When, however, the ion beam is accelerated, it is sometimes necessary to reduce a current density of an ion beam initially extracted by the ion extracting electrode as compared with the case where the ion beam is decelerated, in order to avoid the divergence of the ion beam. Either one of the acceleration and deceleration of the ion beam is suitably selected according to conditions for processing the substrate S, i.e., the kind of the substrate S, the required etching rate, the degree of damage, etc.

Figure 13:
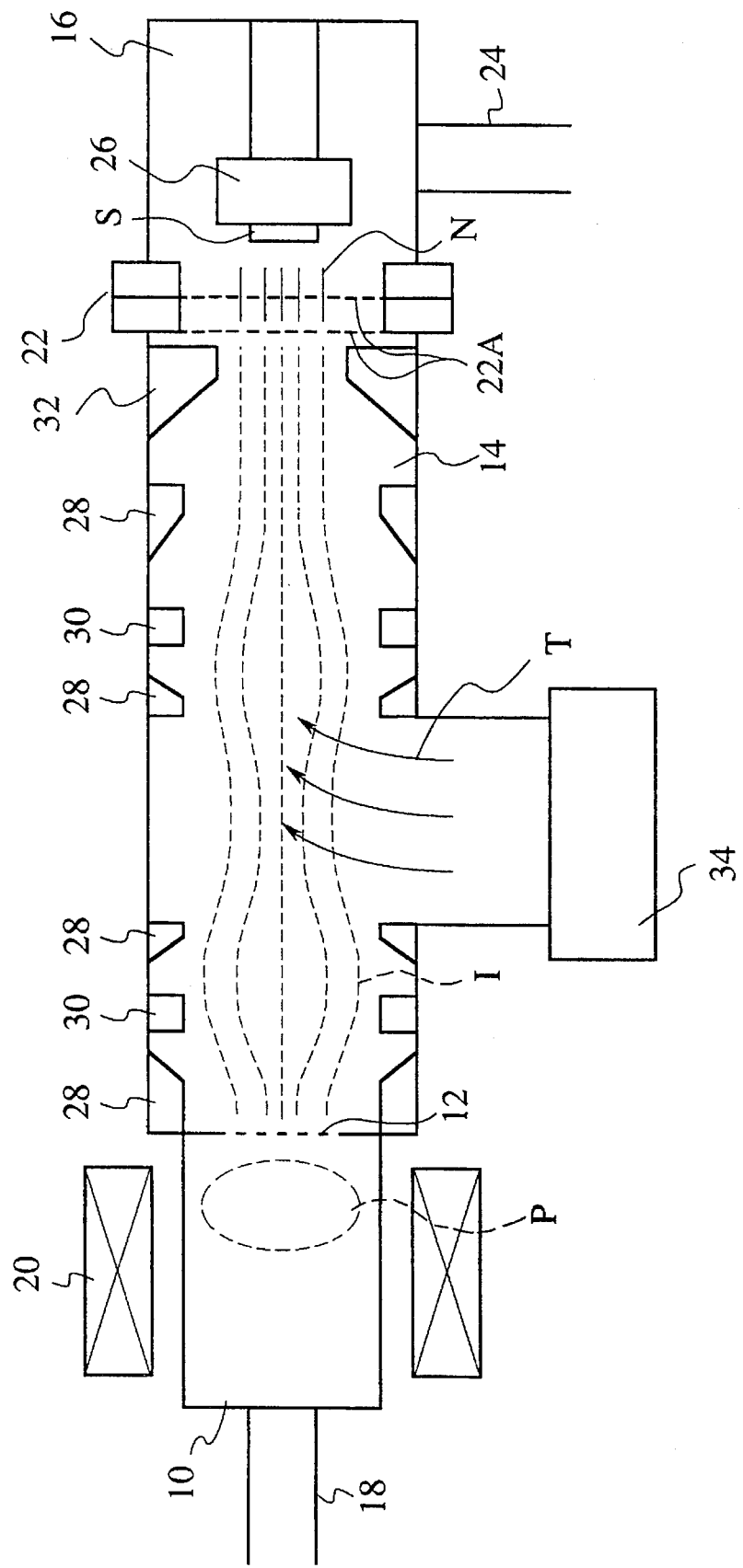
FIG. 13 is a cross-sectional view schematically illustrating a dry etching apparatus according to a fourth embodiment of the present invention.

FIG. 13 is a cross-sectional view showing a dry etching apparatus according to a fourth embodiment of the present invention and corresponding to FIG. 6.

The dry etching apparatus according to the present embodiment is substantially identical in structure to that shown in FIG. 6 according to the third embodiment except that an exciter or exciting device 34 for bringing a produced neutral beam into an excited state is attached to a neutralizing chamber 14.

In the present embodiment, the direction of an ion beam can be made even or parallel and the speed of the ion beam can be suitably controlled in a manner similar to the third embodiment. Further, a neutral beam produced from the ion beam within the neutralizing chamber 14 can be brought into a chemically excited state. Therefore, high-precision etching can be carried out at higher speed.

Figure 14:
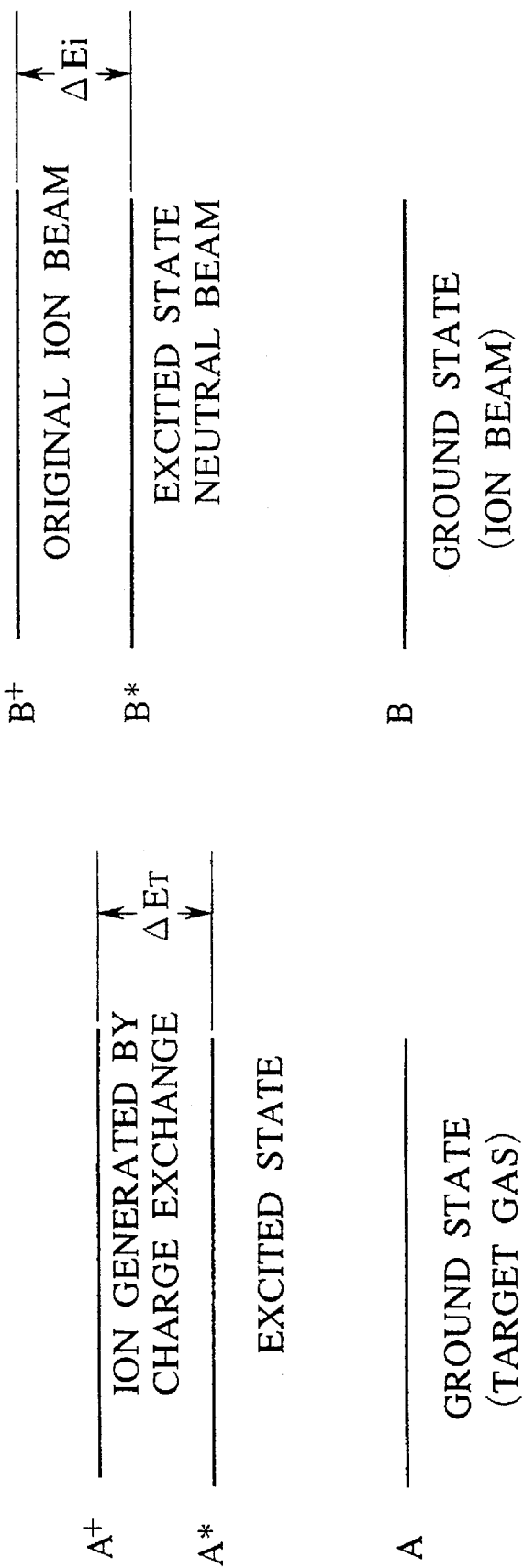
FIG. 14 is an energy status view for describing the principle of excitation of a neutral beam.

FIG. 14 is an energy status view for conceptionally describing the principle of conversion of a neutral beam produced from an ion beam by a charge-exchange reaction into an excited neutral beam by the exciting device 34 simultaneously with the charge-exchange reaction.

In the case of the charge-exchange reaction at the time that the exciting device 34 is not provided, a target gas T is in a ground state indicated by A in FIG. 14, whereas a produced neutral beam N is also in a ground state indicated by B in FIG. 14.

In the present embodiment, the exciting device 34 can bring the target gas T into an excited state indicated by A* in FIG. 14. Therefore, the neutral beam N generated by the charge-exchange reaction can be brought into an excited state indicated by B* in FIG. 14. At this time, the following conditions are required that neutral particles in an excited state generated by the exciting device 34 are held until they are transported into a space for effecting charge exchange between the neutral particles and the ion beam I. That is, the life time of the excited state is held for a given time interval. Further, an energy gap $\Delta E_T$ between the excited state A* of the target gas T and an ion state A$^+$ thereof and an energy gap $\Delta E_i$ between the excited state B* of the ion beam I and an ion state B$^+$ thereof (of original ion beam) are substantially equal to each other. Alternatively, $\Delta E_T$ is less than $\Delta E_i$ ($\Delta E_T < \Delta E_i$).

When ion beam particles and target neutral particles are identical in kind to one another, $\Delta E_T$ is normally equal to $\Delta E_i$. It is therefore preferable that the particles same in kind are used upon the charge-exchange reaction. However, particles different in kind from each other may be used according to conditions. The desired life time of the neutral particles in an excited state varies according to the size of the dry etching apparatus but may be normally about μ sec or longer.

In the present embodiment, an X-ray generator or a light generator for generating any one of ultraviolet light, a visible ray and an infrared ray may be used as the exciting device 34 to optically excite a neutral beam produced by the charge-exchange reaction. Further, a low-energy type electron beam generator may be used so as to excite a neutral beam under electron collision, or a radio-frequency discharge plasma generator may be used so as to excite the target gas up to the electrically excited states. The position where the exciting device 34 is to be mounted is not necessarily limited to the position shown in FIG. 13. This position may be changed as needed if it is of the position where the neutral particles can be excited.

A description will now be made of the result of actual etching of the polysilicon layer deposited onto the silicon substrate by the dry etching apparatus according to each of the third and fourth embodiments.

In the plasma chamber 10, $Cl_2$ gas is first brought into a plasma state. Then, an ion beam composed of $Cl^+$ and $Cl_2^+$ is extracted from the produced plasma so as to be introduced into the neutralizing chamber 14. The ion beam is neutralized under the charge-exchange reaction to produce a neutral beam. When the polysilicon layer on the silicon substrate S attached to the holder 26 was etched by the neutral beam, the result shown in FIG. 15 was obtained.

Figure 15:
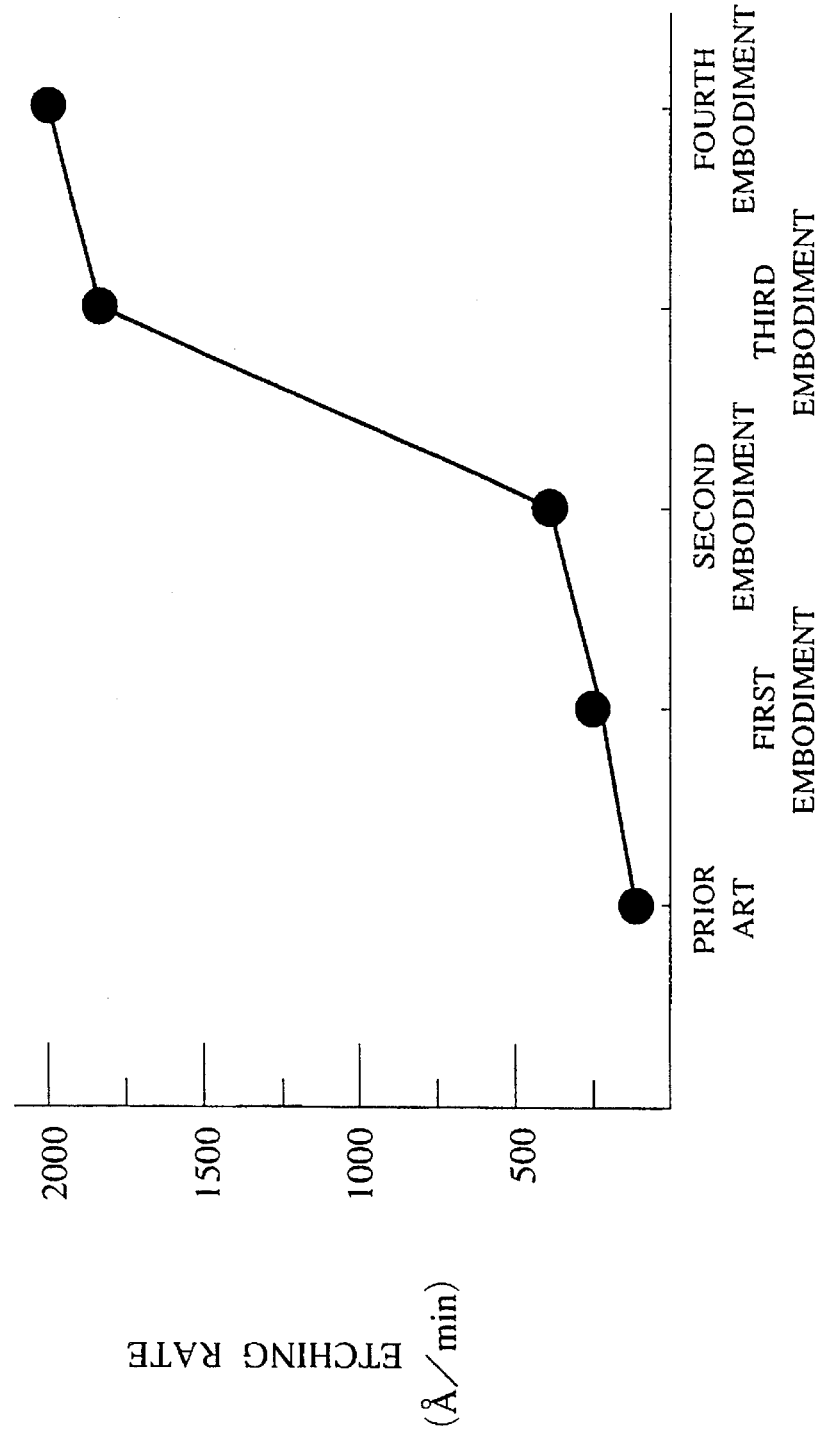
FIG. 15 is a diagrammatic view for describing the comparison between etching rates employed in the prior art and the present invention.

FIG. 15 collectively shows the results (etching rates) obtained when the dry etching apparatuses according to the third and fourth embodiments have been applied, the result obtained by the conventional method for comparison and the results obtained by the dry etching apparatuses according to the first and second embodiments for reference. Incidentally, the conventional method used herein makes use of an apparatus having a structure shown in FIG. 31.

The initial energy of the ion beam, the ion beam flux and the gas pressure in the neutralizing chamber 14 were all equally set between the respective dry etching apparatuses according to the first through fourth embodiments and were respectively represented as 500 eV, 1 mA/$Cm^2$ and $3\times10^{-4}$ Torr. In each of the third and fourth embodiments, the ion beam was decelerated to 50 eV. In the fourth embodiment in particular, an RF discharge plasma device for generating neutral particles held in the excited state was used as the exciting device 34 to produce a $Cl^*$ atom and a $Cl_2^*$ molecule both held in the excited state.

Each of the dry etching apparatuses according to the third and fourth embodiments could obtain sufficient and practical etching rates (velocities) of 1500 Å/min through 2000 Å/min. Further, each of the dry etching apparatuses according to the first and second embodiments could also obtain an etching rate of three times or above the etching rate obtained by the conventional method.

Figure 16:
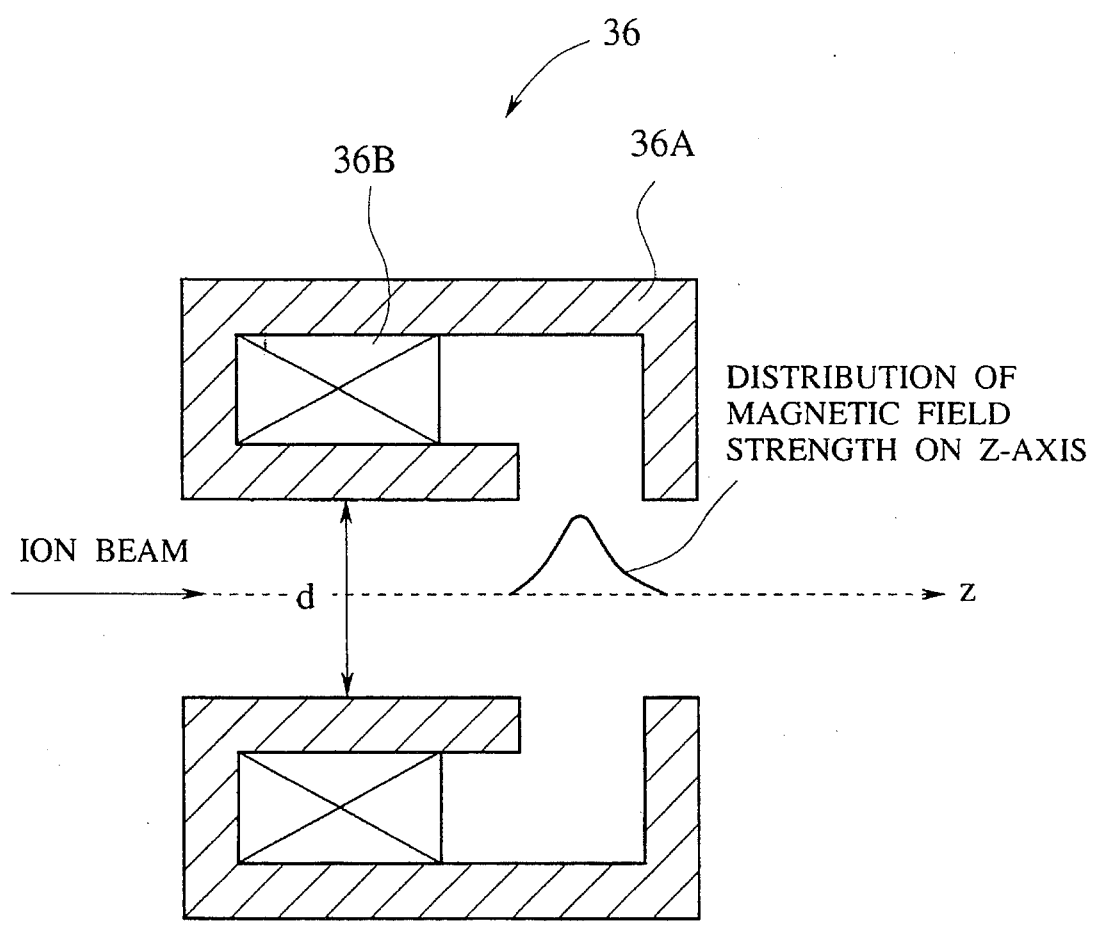
FIG. 16 is a schematic cross-sectional view showing one example of a magnetostatic field lens.

FIG. 16 is a schematic cross-sectional view showing one magnetostatic filed lens applied to a dry etching apparatus according to a fifth embodiment of the present invention.

The dry etching apparatus according to the present embodiment is substantially identical in structure to that according to the first embodiment except that a magnetostatic field lens 36 shown in FIG. 16 is disposed in the form of one or two and more as an alternative to the static electric field lenses (the first electrodes 28 and the second electrode 30) shown in FIG. 1.

As illustrated in FIG. 16, the magnetostatic field lens 36 is represented in the form of a cross-section as seen in the plane including a Z-axis where the center of the cylindrical neutralizing chamber 14 is defined as the Z-axis. The magnetostatic field lens 36 has a structure rotatable and symmetrical about the Z-axis. The magnetostatic field lens 36 comprises a yoke 36A shaped in the form of a partly-cut square and having a frame-shaped cross-section, and a coil 36B fitted in the yoke 36A. An ion beam passes through a space of an inside diameter d.

The form (strength distribution of a magnetic field on the Z-axis) of a magnetic field produced by the magnetostatic field lens 36 is represented in the form of a bell as illustrated in FIG. 16. The strength distribution of the magnetic field on the Z-axis is given in the form of the following equation (1). The focal length f of the magnetostatic field lens 36 at this time is represented in the form of the following equation (2).

$$B(Z)=B_0/\{1+(Z/d)^2\} \qquad (1)$$

$$f=d/\sin(\pi/\omega) \quad \omega=(1+k^2)^{1/2} \qquad (2)$$

where k represents a parameter indicative of strength of a lens and is proportional to coil current and the number of turns of the coil.

In the present embodiment, the ion beam can be converged or focused by forming the magnetic field having the above-described strength distribution. The magnetostatic field lens is large in shape as compared with the static electric field lens. However, the magnetostatic field lens can treat a wide range of beam energy as an advantage. By providing the magnetostatic electric field lens in the form of, for example, two stages or more side by side along the Z-axis direction, the ion beam can be prevented from being diverged.

Thus, according to the present embodiment, the ion beam can be prevented from diverging and the direction of the ion beam can be made even or parallel in a manner similar to each of the first through fourth embodiment. It is therefore possible to achieve high anisotropic etching using a neutral beam.

The dry etching apparatus according to the present embodiment may be provided with the velocity control electrode 32 similarly to the third embodiment, or may be provided with the exciting device 34. Further, both the velocity control electrode 32 and the exciting device 34 may be provided similarly to the fourth embodiment.

Figure 17:
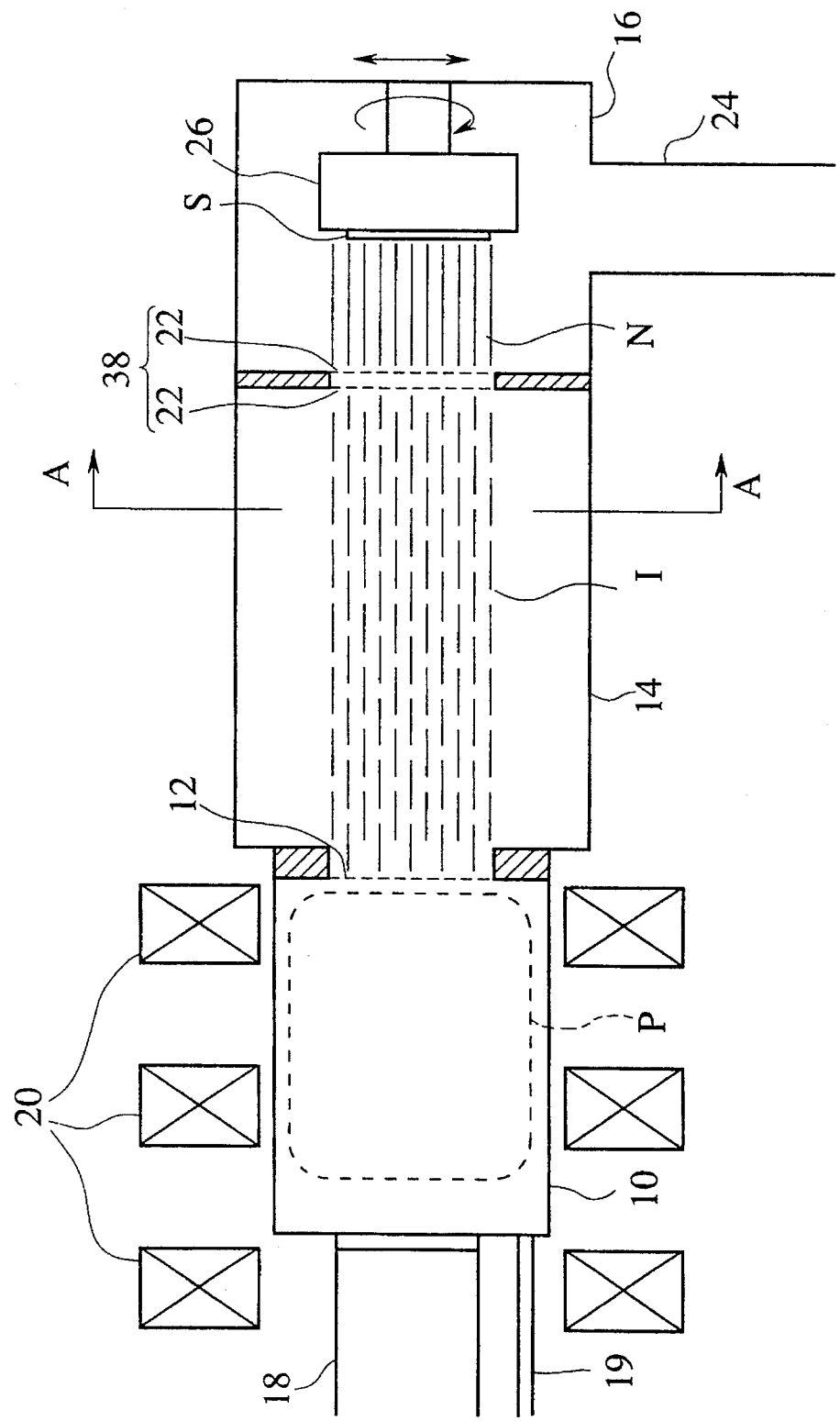
FIG. 17 is a cross-sectional view schematically illustrating a dry etching apparatus according to a sixth embodiment of the present invention.

FIG. 17 is a cross-sectional view schematically showing the structure of a dry etching apparatus according to a sixth embodiment of the present invention.

In the dry etching apparatus according to the present embodiment, two ion retarding electrodes 22 are provided adjacent to each other. Fine holes defined in the ion retarding electrodes 22 are brought into alignment with each other along their surface direction. Further, the two ion retarding electrodes 22 serve as a collimator 38. A holder 26 is movably provided in such a manner that a processing face (surface) of a substrate S to be processed, which has been attached to the holder 26, can be moved in a direction parallel to its processing surface.

The dry etching apparatus according to the present embodiment is substantially identical in structure to that according to the first embodiment except that the former has the aforementioned features. However, an electromagnet 20 is provided in plural form and a gas introduction tube (line) 19 is shown.

Figure 18:
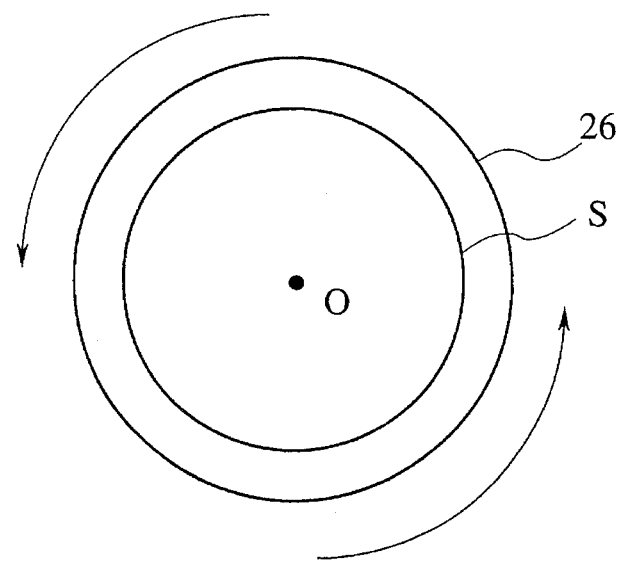
FIG. 18 is a view for describing the operation of a holder employed in the dry etching apparatus shown in FIG. 17.

FIG. 18 is an enlarged plan view of the holder 26 of the above dry etching apparatus as seen in the direction perpendicular to the processing surface of the substrate S attached to the holder 26.

In the present embodiment, the holder 26 is coaxially rotated with a substantial center of the substrate S attached thereto as the center O of rotation as shown in FIG. 18. Thus, the coaxial rotation of the holder 26 can provide the processing surface of the substrate S attached thereto with the similar coaxial rotation.

In the present embodiment as well, the two ion retarding electrodes 22 form the collimator 38 for restricting the direction of a neutral particle beam. Therefore, the distribution of neutral beam flux is deviated on the substrate S due to the action of each ion retarding electrode 22 when the substrate S is in a fixed state thereby to produce unevenness on the processed surface of the substrate S. Since, however, the holder 26 is coaxially rotated as described above, the unevenness on processing can be prevented from occurring.

When the holder 26 is coaxially rotated as described above where one substrate S has been attached to the holder 26 as illustrated in FIG. 18, the coaxial rotation has no influence on a portion corresponding to the center O of rotation of the substrate S. Thus, the substrate S having the center O has a drawback, that is, a difference in processing speed is produced between the central portion and respective portions other than the central portion. Since, however, the portions other than the central portion corresponding to the center O are uniformly irradiated with the neutral beam, the unevenness on processing can be greatly reduced as compared with the case where the holder 26 is not coaxially rotated.

If a plurality of substrates S are attached to the holder 26 and simultaneously processed, the above drawback can be solved by mounting each of the substrates S in a state being deviated out of the center O of rotation of the holder 26.

A description will next be made of a dry etching apparatus according to a seventh embodiment of the present invention.

Figure 19:
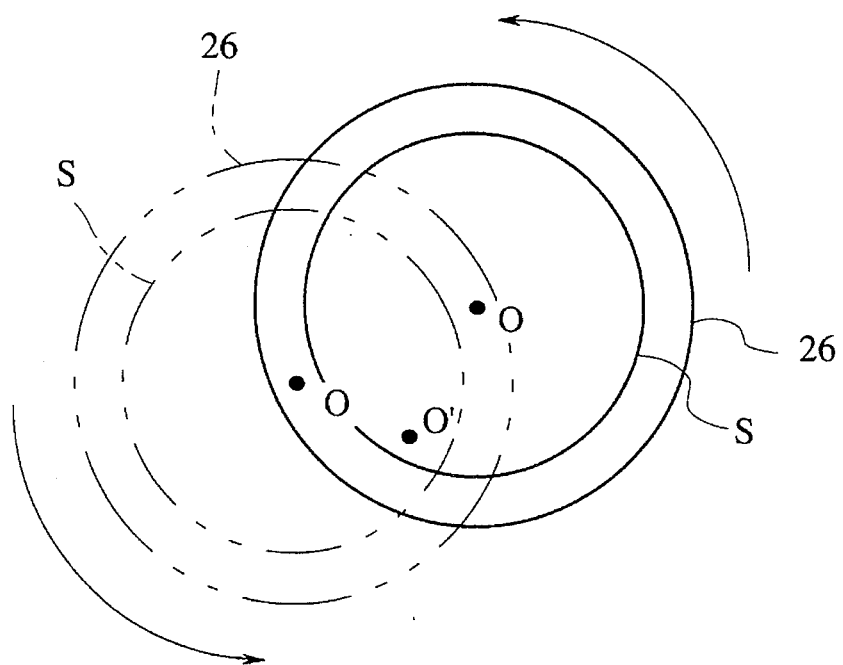
FIG. 19 is a view for explaining the operation of a holder employed in a dry etching apparatus according to a seventh embodiment of the present invention.

The dry etching apparatus according to the present embodiment is substantially identical in structure to that according to the sixth embodiment except that a holder 26 can be eccentrically rotated as illustrated in FIG. 19 corresponding to FIG. 18.

That is, when one substrate S is attached to the holder 26, the holder 26 makes it possible to cause coaxial rotation in which O identical to that shown in FIG. 18 is defined as the center and at the same time eccentric rotation in which O' deviated from the center is defined as the center of rotation.

In the present embodiment, the center O of coaxial rotation, which is located substantially in the center of the substrate S, is also displaced in the direction parallel to the processing surface of the substrate S in accordance with the eccentric rotational movement of the holder 26. Therefore, the unevenness on processing between the portion corresponding to the center O of the substrate S and other portions as in the case of the sixth embodiment is no longer produced, thus enabling uniform processing as a whole even when one substrate S is used.

A description will next be made of a dry etching apparatus according to an eighth embodiment of the present invention.

Figure 20:
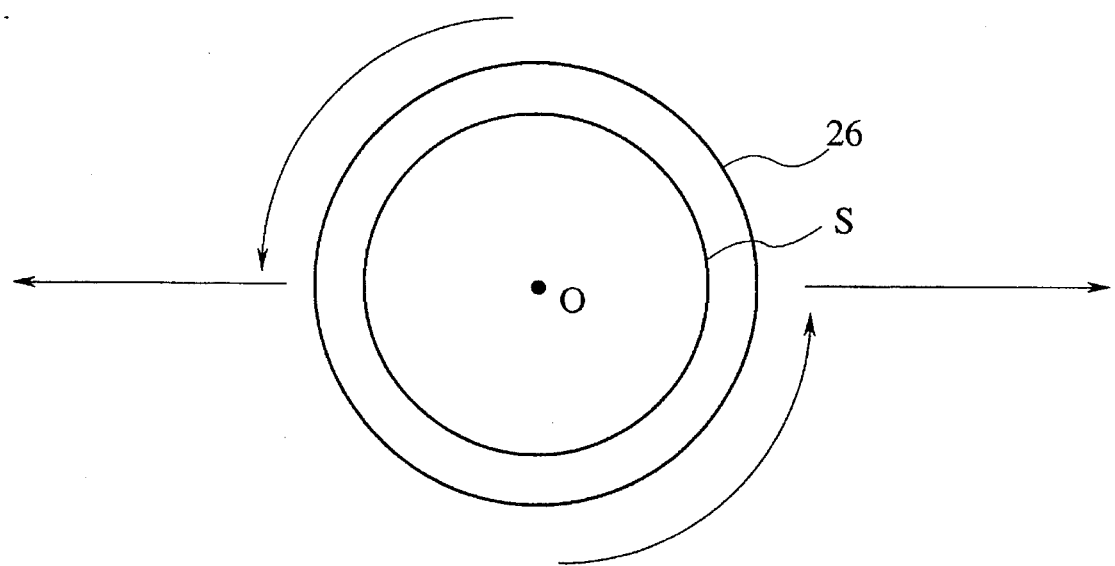
FIG. 20 is a view for describing the operation of a holder used in a dry etching apparatus according to an eighth embodiment of the present invention.

The dry etching apparatus according to the present embodiment is substantially identical in structure to that according to the sixth embodiment except that a holder 26 can make simultaneously both coaxial rotation in which O is defined as the center and linear reciprocating motion made along a direction parallel to a processing surface of a substrate S as illustrated in FIG. 20 corresponding to FIG. 18.

Since the holder 26 is coaxially rotated and linearly reciprocated in the present embodiment, uniform processing can be effected over the entire surface of the substrate S. Since the dry etching apparatus according to the present embodiment makes use of the coaxial rotation, the dry etching apparatus is simplified in structure as compared with that according to the seventh embodiment. If, however, the holder 26 is reciprocated by a distance corresponding to the diameter of the substrate S to uniformly irradiate the entirety of the substrate S with a neutral beam, for example, it is then necessary to make the dry etching apparatus wide by the distance referred to above.

A description will now be made of a dry etching apparatus according to a ninth embodiment of the present invention.

Figure 21:
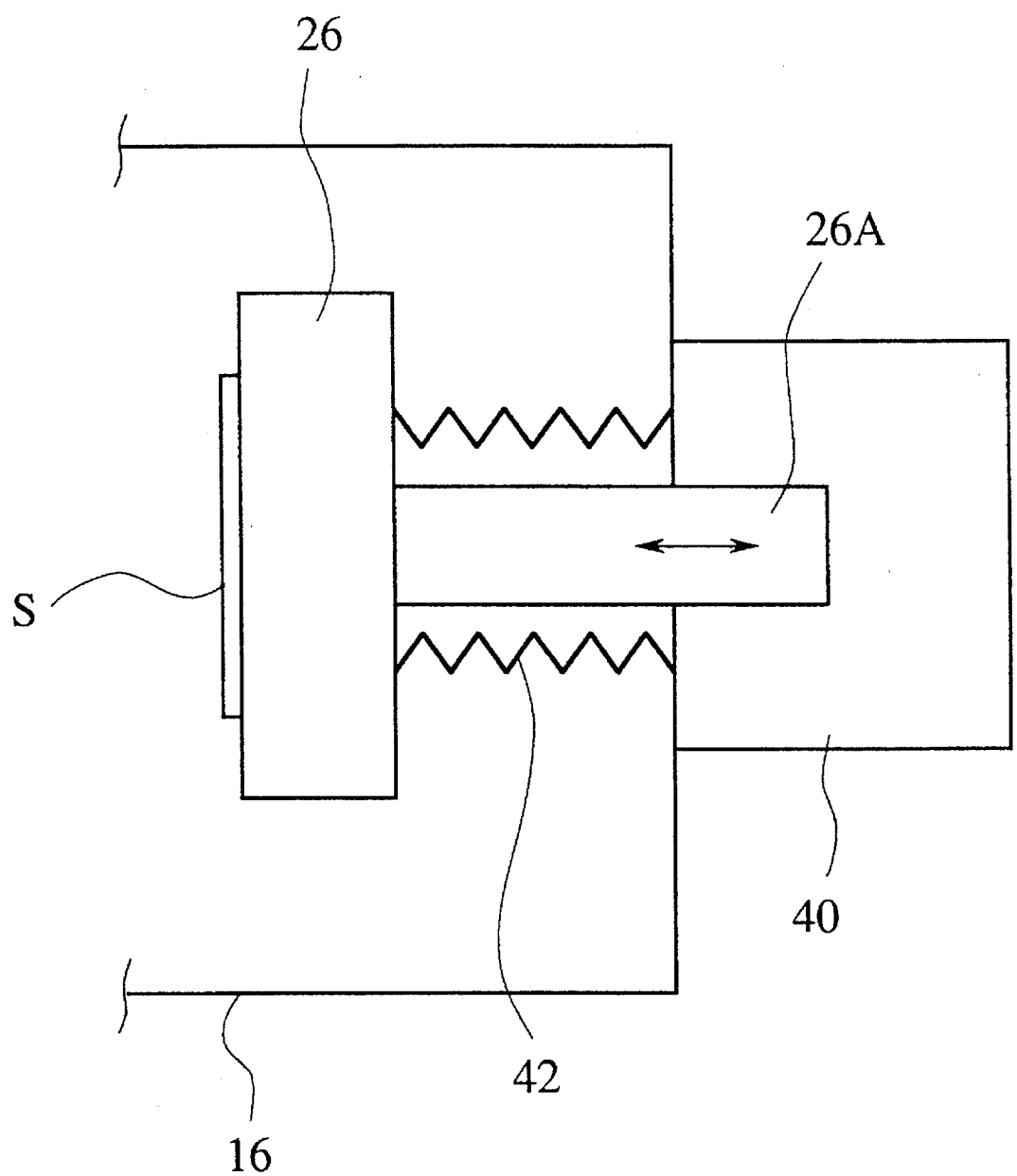
FIG. 21 is a schematic cross-sectional view illustrating a principal part of a dry etching apparatus according to a ninth embodiment of the present invention.

The dry etching apparatus according to the present embodiment is substantially identical in structure to that shown in FIG. 17 according to the sixth embodiment except that as is apparent from a principal part of the dry etching apparatus shown in FIG. 21, a holder 26 can be moved back and forth in the direction orthogonal to a processing surface of a substrate S, i.e., in the direction in which each ion retarding electrode 22 extends. However, a bellows 42 is mounted on a slidable shaft 26A of the holder 26 to prevent undesired materials from being diffused into the dry etching apparatus when in operation.

In the present embodiment, the distance between a collimator 38 (two ion retarding electrodes 22) serving as a neutral beam source in a processing chamber 16 and the holder 26 can be varied. It is therefore possible to adjust the distance between the processing surface of the substrate S and the collimator 38 to a suitable spaced distance. Thus, when the directivity of the neutral beam which has passed through the collimator 38, is high, a shadow of the collimator 38, i.e., a portion of the neutral beam which did not passed through the collimator 38, is transferred onto the substrate S to be processed when the collimator 38 is located near the substrate S. Thus, the unevenness is formed onto the surface of the substrate S. However, the unevenness on processing can be prevented from occurring by setting the distance between the substrate S and the collimator 38 to a suitable distance according to the degree of divergence of the neutral beam which has passed through the collimator 38.

Figure 22:
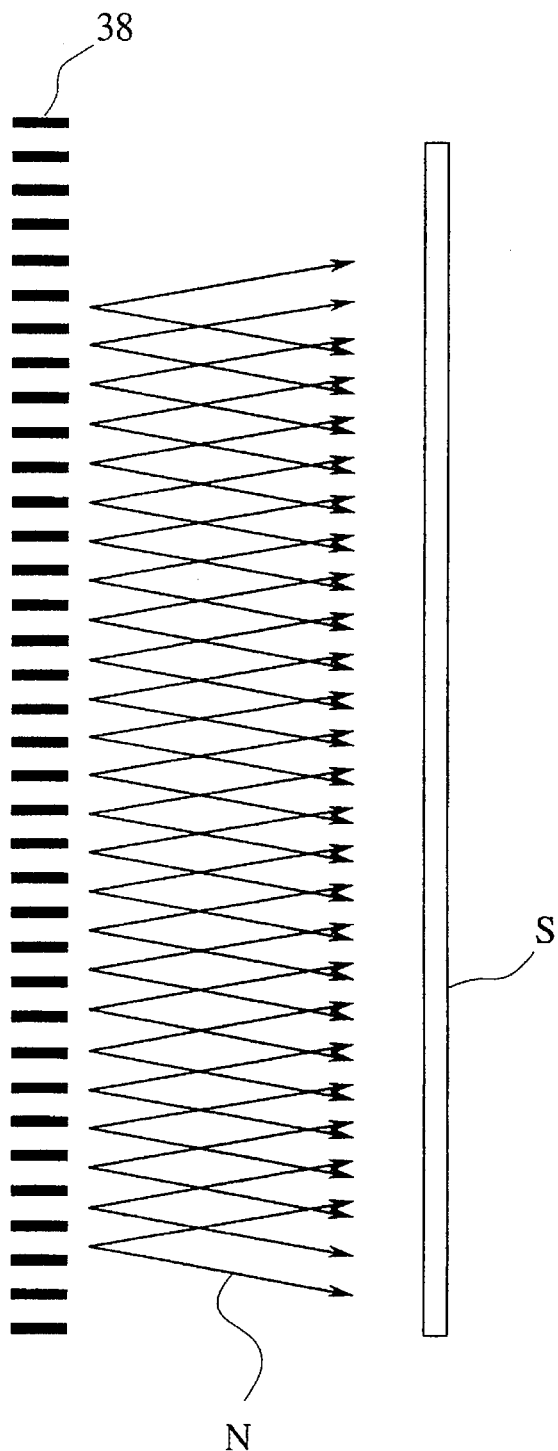
FIG. 22 is a view for explaining the operation of the dry etching apparatus shown in FIG. 21.

That is, as is understood from the relationship shown in FIG. 22 between the substrate S and the collimator 38, the unevenness produced due to the directivity of the neutral beam can be effectively prevented from occurring by setting the substrate S to the point of overlap of the neutral beam transmitted through the collimator 38, thus enabling uniform processing.

Figure 23:
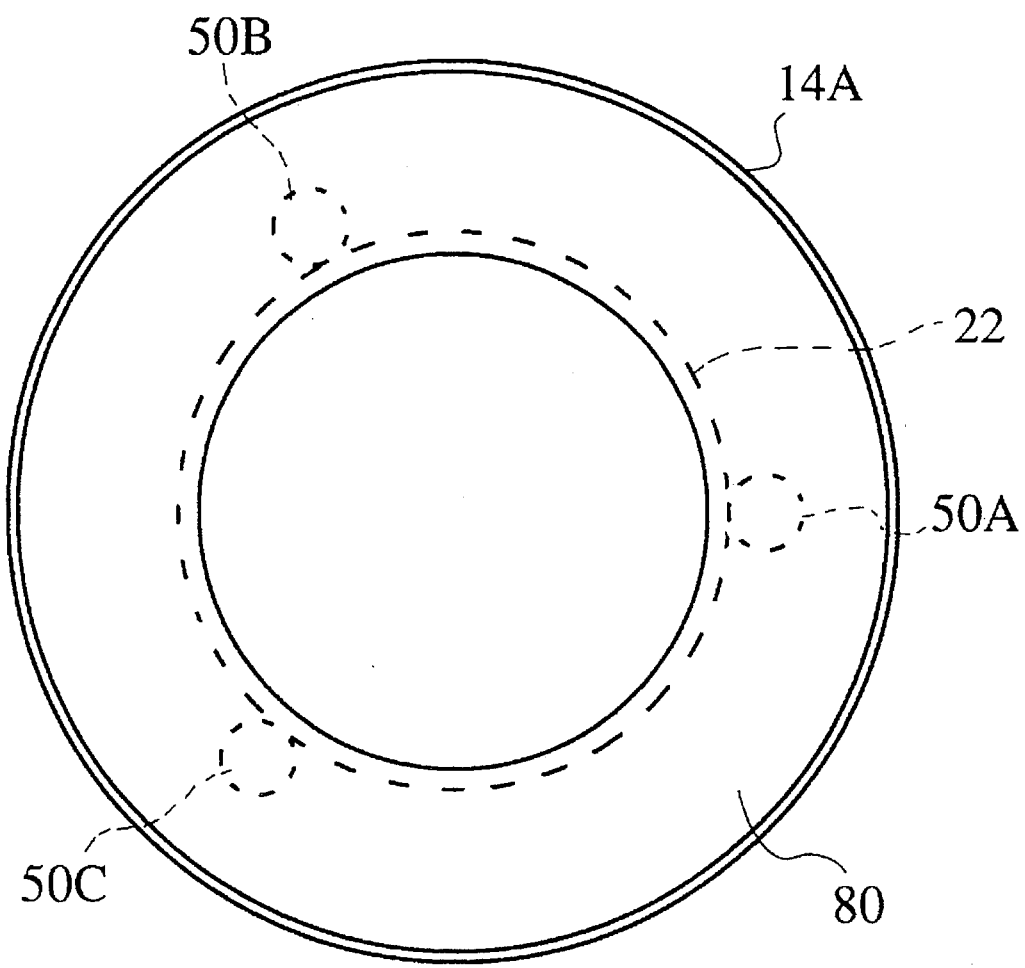
FIG. 23 is a cross-sectional view illustrating the summary of a feature of a dry etching apparatus according to a tenth embodiment of the present invention and taken along line A—A of FIG. 17.

FIG. 23 is a schematic cross-sectional view showing a feature of a dry etching apparatus according to a tenth embodiment of the present invention and corresponding to a sectional view taken along line A—A of FIG. 17.

The dry etching apparatus according to the present embodiment is substantially identical in structure to that according to the sixth embodiment shown in FIG. 17 except that as shown in FIG. 23, ion retarding electrodes 22 are supported by three gears 50A through 50C and rotatable in a direction (i.e., in a direction orthogonal to an incident direction of a neutral beam) parallel to a processing surface of a substrate S.

Figure 24:
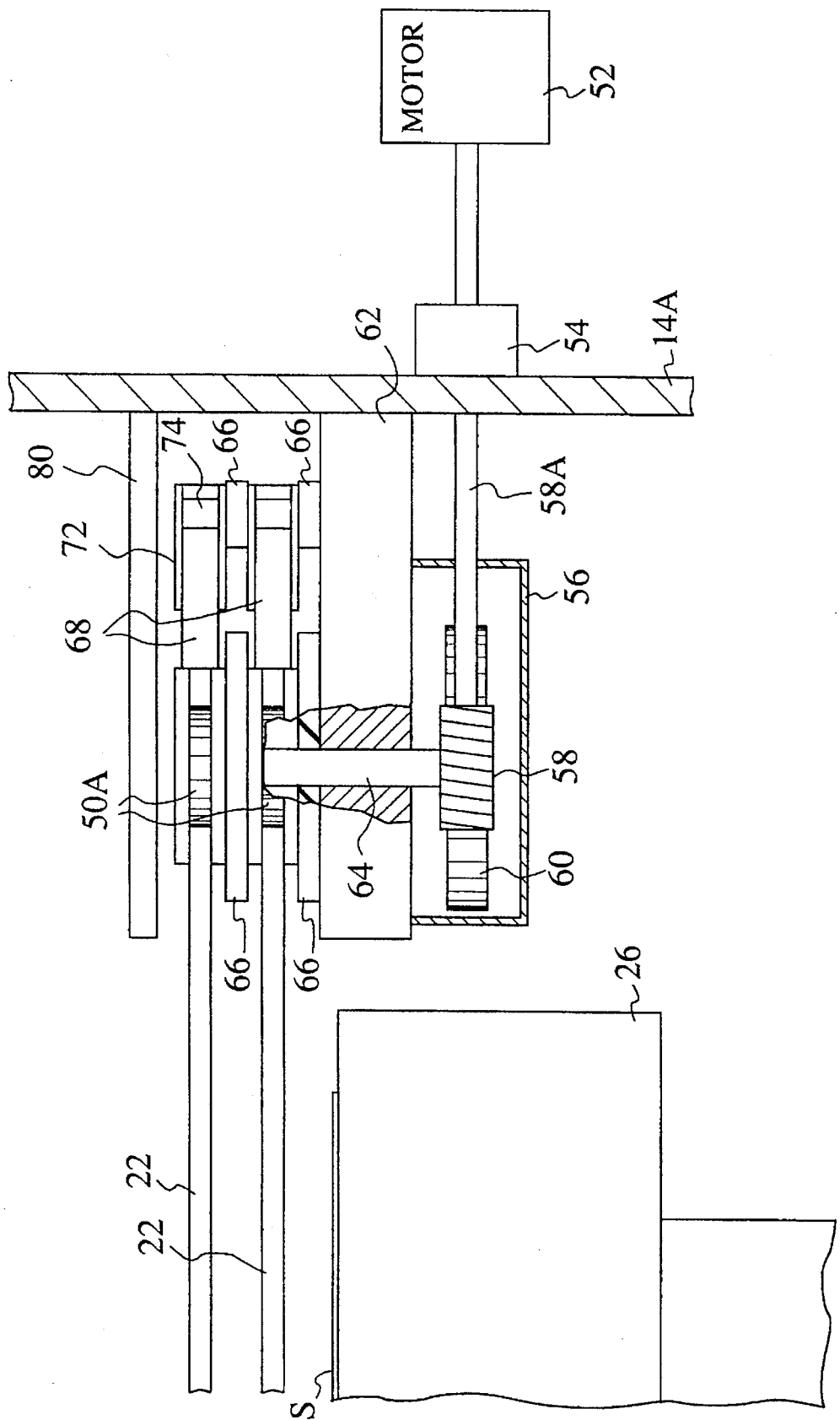
FIG. 24 is a partly enlarged cross-sectional view illustrating a mechanism for transmitting a rotational driving force to each of ion retarding electrodes.
Figure 25:
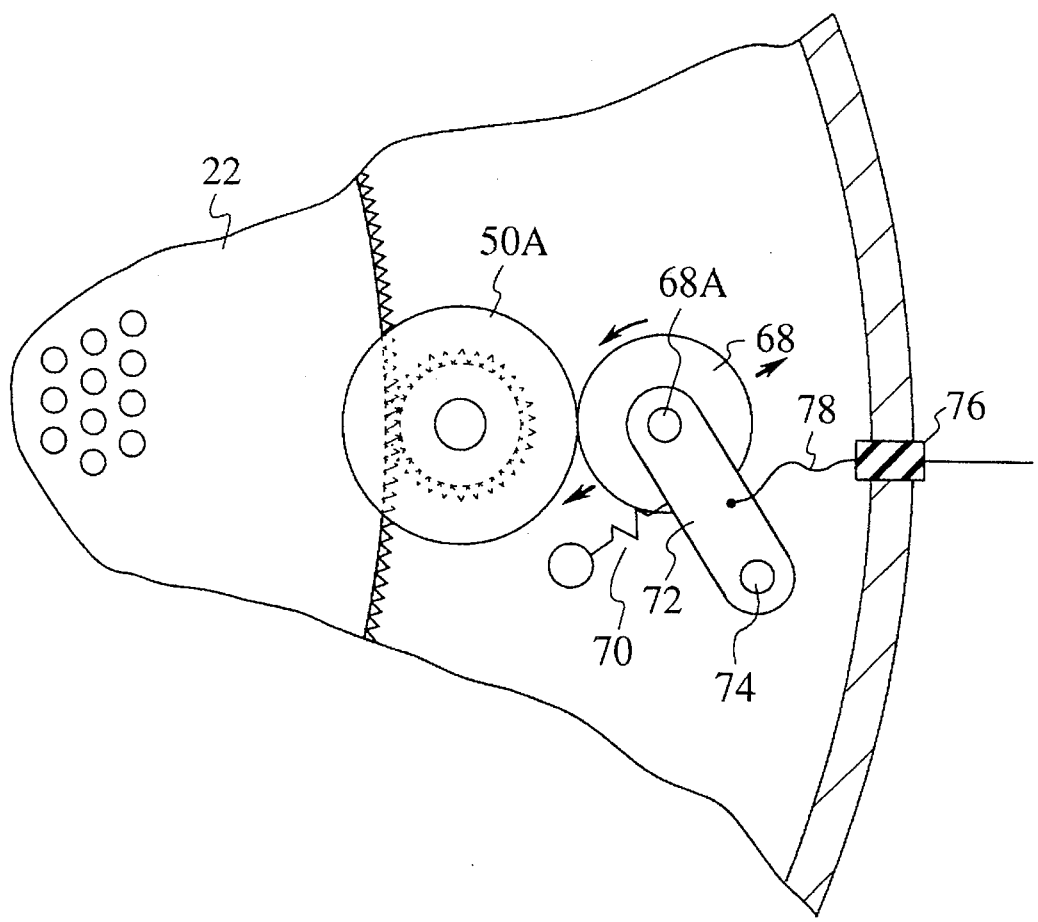
FIG. 25 is a plan view showing the transmission mechanism depicted in FIG. 24.

FIG. 24 is a fragmentary cross-sectional view showing, in enlarged form, the ion retarding electrodes 22 and their adjacent portions at the time that the inside of the dry etching apparatus is seen from its vertical direction. FIG. 25 is a partly plan view showing the fragmentary part as seen from above in FIG. 24.

In the dry etching apparatus, power is transmitted from a motor 52 provided outside a vacuum container or vessel 14A of a neutralizing chamber 14 to the gear 50A alone, which in turn rotatably drives the two disc-shaped ion retarding electrodes 22.

A mechanism for rotatably driving the ion retarding electrodes 22 will now be described in detail. The rotational driving force produced from the motor 52 firstly passes through a rotation introducing device 54 and is then transmitted to a worm gear 58 disposed within a gear case 56 through a shaft 58A. Further, the driving force is transmitted to a spur or flat gear 60 in the gear case 56 as a rotational driving force whose direction has been shifted by 90°.

The flat gear 60 is coupled to one end of a rotatable shaft 64 supported by a gear mounting plate 62 and the gear 50A is similarly coupled to the other end of the rotatable shaft 64. The gear 50A is made up of two mutually-insulated gears with one of insulating spacers 66 comprised of alumina interposed therebetween. The lower gear 50A is insulated from the body of the dry etching apparatus by the insulating spacer 66 interposed between the lower gear 50A and the gear mounting plate 62.

The two gears 50A are maintained in meshing engagement with gear teeth formed at the same pitch onto the peripheries of the two ion retarding electrodes 22.

The gears 50A transmit the rotational driving force to their corresponding ion retarding electrodes 22 and serve as conductors for supplying a desired voltage to the ion retarding electrodes 22. That is, as shown in FIG. 25, a disc 68 is brought into contact with the outer periphery of a guide of the gear 50A and the strength of contact between its outer periphery and the disc 68 can be adjusted by a spring 70. The disc 68 rotates about a rotatable shaft 68A and the rotatable shaft 68A is secured to one end of an arm 72. The other end of the arm 72 is rotatably supported by a support shaft 74 comprised of an insulating material such as alumina or the like. A voltage is supplied to the arm 72 through a lead 78 introduced via a field through 76.

Each of the arm 72, the disc 68, the gear 50A and the ion retarding electrodes 22 is made of a metal. Therefore, a desired voltage can be supplied to each of the ion retarding electrodes 22 by supplying the voltage to the arm 72 through the lead 78. Incidentally, reference numeral 80 in FIG. 24 indicates a shielding plate. The shielding plate 80 has not been shown in FIG. 25.

According to the present embodiment, as has been described above in detail, the desired voltage can be supplied to the two ion retarding electrodes 22. Further, the two ion retarding electrodes 22 maintained in meshing engagement with their corresponding gears 50A can be coaxially rotated by transmitting the driving force produced from the motor 52 to the two gears 50A. Therefore, the unevenness on processing produced due to the transfer of an opened pattern of each ion retarding electrode 22 onto the substrate S, when the ion retarding electrodes 22 are fixed and they serve as the collimator, can be effectively prevented from occurring, thereby making it possible to uniformly process the substrate S.

The dry etching apparatus describes the case where each of the ion retarding electrodes 22 is shaped in the form of a complete circle. When, however, each ion retarding electrode 22 is of the complete circle, the center of rotation thereof is fixed. Therefore, when one substrate S to be processed is attached to the holder 26, the unevenness is produced in the vicinity of the center of the substrate S. Thus, in this case, a mechanism moved in parallel along the direction (i.e., in the direction parallel to the processing surface of the substrate S) orthogonal to the direction of the neutral beam may preferably be provided so as to move the holder 26 in the same direction. By doing so, the uniform processing can be reliably effected over the entire surface of the substrate S even when one substrate S is used.

When chemically active gases such as chlorine gas, fluorine gas, etc. are used for surface processing, the motor 52 for rotatably driving the ion retarding electrodes 22 may be provided outside the vacuum vessel 14A as described above. However, the motor 52 may be disposed within the vacuum vessel 14A as necessary.

In order to supply the voltage to the gear 50A, the slidable portion may not be disposed within the vacuum vessel 14A. This is because the inside of the dry etching apparatus can be kept clean. Therefore, the disc 68 may preferably be used but a brush terminal employed in a DC motor may be used.

Further, each ion retarding electrode 22 may be shaped in the form of, for example, an ellipsoid other than the complete circle. In this case, each ellipsoidal ion retarding electrode can be rotated similarly by fixing the gear 50A and enabling each of the remaining gears 50B and 50C to be moved in parallel to the surface of rotation thereof.

Thus, when each ion retarding electrode 22 is shaped in the form of the ellipsoid, a plurality of holes used for a collimator, which are defined in each of the ion retarding electrode, can be all changed or shifted in position with respect to the substrate S according to the rotation of each ion retarding electrode. Therefore, the unevenness produced on the processing surface of the substrate S can be removed without a parallel displacement of the holder 26. Further, when each ion retarding electrode 22 is shaped in the form of the ellipsoid, it is unnecessary to provide the above-described holder moving mechanism. Therefore, the dry etching apparatus can be simplified in structure and hence fabricated at low cost.

Figure 26:
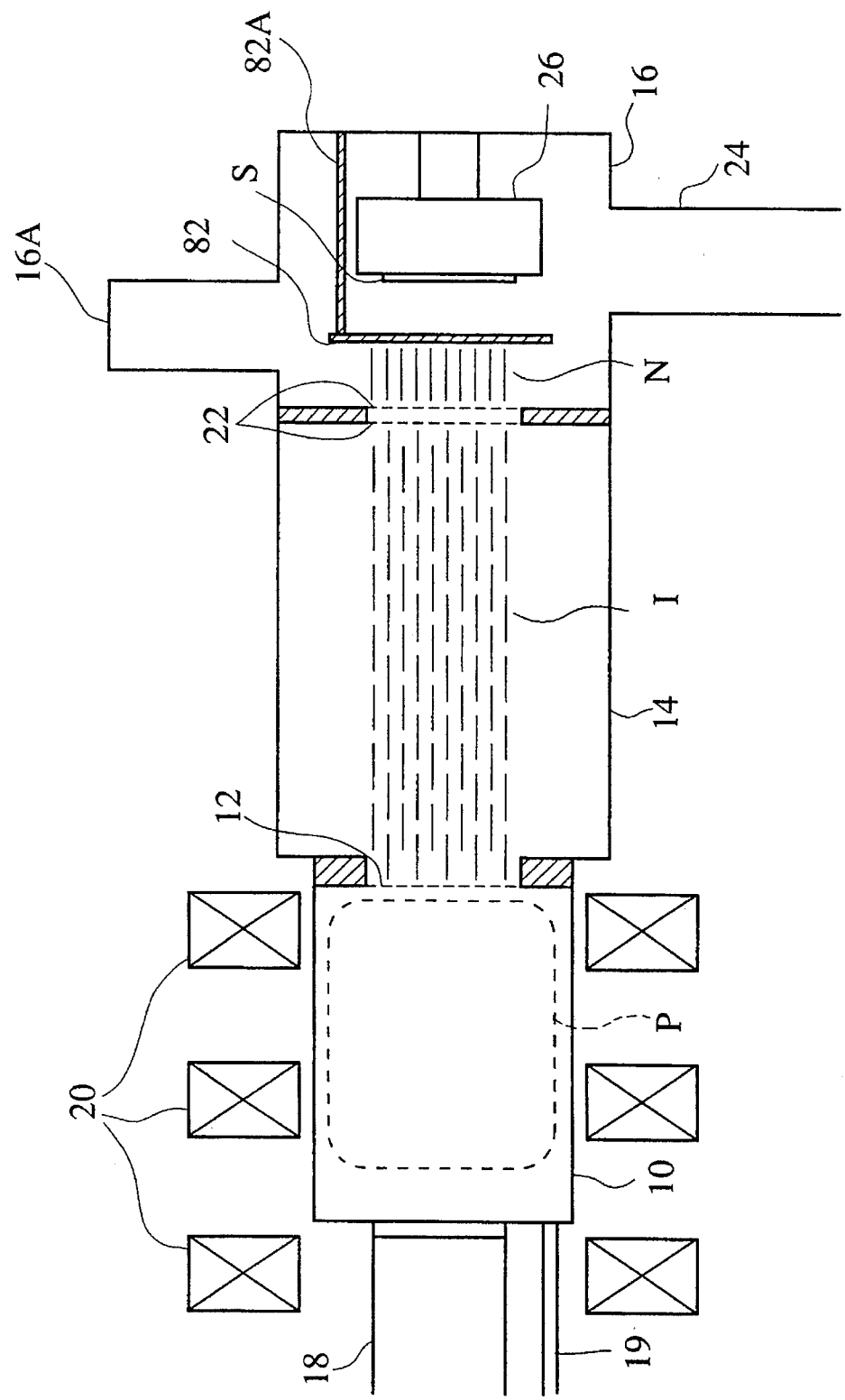
FIG. 26 is a cross-sectional view schematically illustrating a dry etching apparatus according to an eleventh embodiment of the present invention.

FIG. 26 is schematic cross-sectional view showing a dry etching apparatus according to an eleventh embodiment of the present invention and corresponding to FIG. 17.

The dry etching apparatus according to the present embodiment is substantially identical in structure to that according to the sixth embodiment (see FIG. 17) except that a disc-shaped shutter 82 is provided between ion retarding electrodes 22 and a holder 26 so as to be rotatable about a rotatable shaft 82A attached to a position near an edge of the shutter 82 and a part of a side-wall portion of a processing chamber 16 is enlarged as a moving space for rotatably driving the shutter 82.

Figure 27:
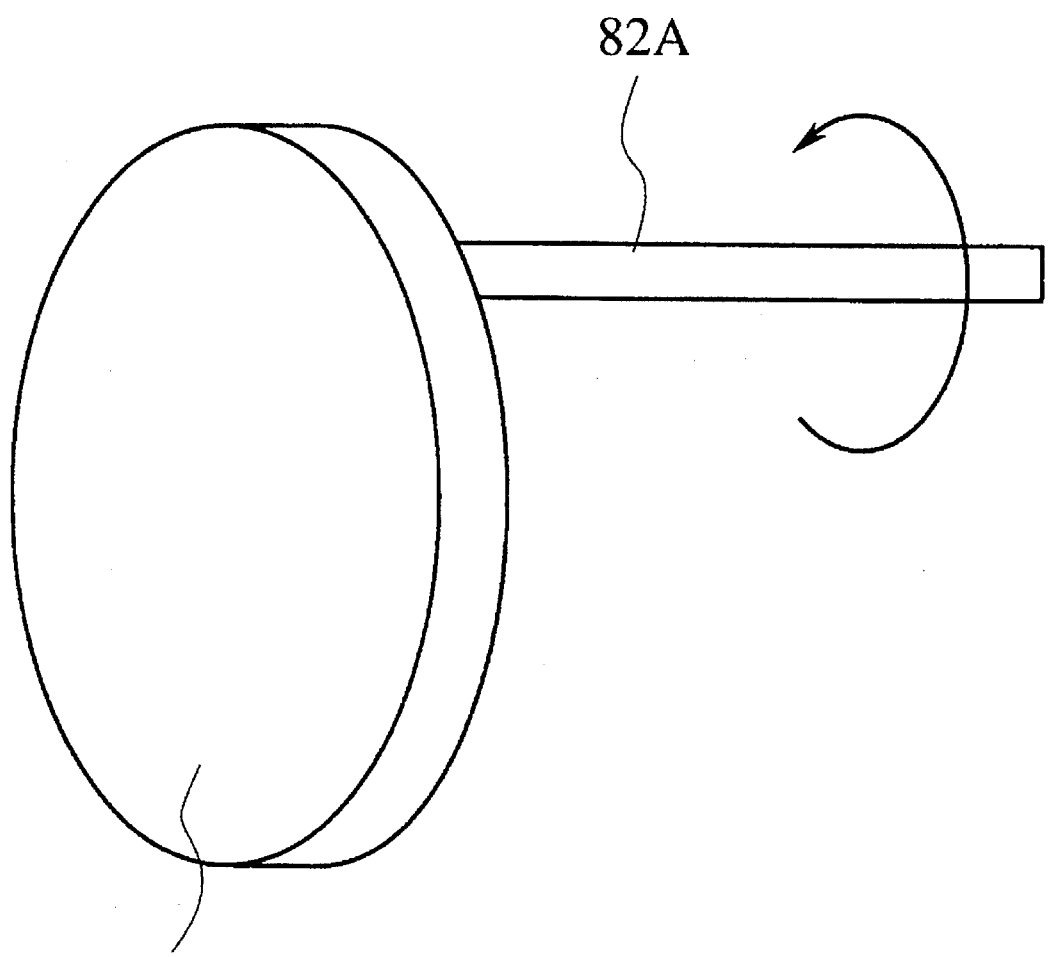
FIG. 27 is a perspective view showing, in enlarged form, a shutter employed in a dry etching apparatus shown in FIG. 26.

FIG. 27 is a perspective view showing the shutter 82 alone in enlarged form. The shutter 82 is made up of carbon.

According to the present embodiment, as described above, the shutter 82 is provided between the ion retarding electrodes 22 and the holder 26. Therefore, high anisotropic etching can be effected on a substrate S to be processed, using a neutral beam upon operation of the dry etching apparatus by accommodating the shutter 82 within a large-diameter portion 16A.

When the so-processed substrate S is replaced by the next substrate S, the shutter 82 is rotated about the rotatable shaft 82A so as to be moved to the position shown in FIG. 26. As a result, the irradiation of the substrate S with the neutral beam can be cut off or blocked, thus enabling the replacement referred to above.

Thus, according to the present embodiment, since the neutral beam can be cut off behind the ion retarding electrodes 22, the dry etching apparatus can continue operating even upon replacement of the substrate S with another. Further, a plasma chamber 10, an ion extracting electrode 12, a neutralizing chamber 14, the ion retarding electrodes 22, etc. can be maintained at the same state. It is therefore possible to process the replaced substrate S under the same operating conditions as those for the previous processing. Accordingly, uniform processing can be effected on the substrate S under the stable conditions for each processing.

According to the present embodiment as well, only the neutral beam is cut off or blocked behind the ion retarding electrodes 22 by the shutter 82. Therefore, the amount of sputtering of the shutter can be greatly reduced as compared with the case where the ion beam is cut off by disposing the shutter in the neutralizing chamber 14. Thus, the inside of the dry etching apparatus can be kept clean.

Incidentally, the present embodiment makes use of the shutter 82 made of carbon but is not necessarily limited to such a material.

Example of materials for the formation of the shutter 82 may preferably include those in which a sputtering yield by the irradiation of the neutral beam is low and work is easy. A metal may be used in terms of workability. In terms of the sputtering yield, it, however, increases in order of C, Ti, V, W, Mo, Co, Cr, Ni, Cu and Au. Thus, actually available materials can be selected by reference to above points and from the relationship in kind between neutral beams to be used. Of these components, the carbon (C) has a low sputtering yield of about 1/10 that of the titanium (Ti). Therefore, the carbon is suitable where the neutral beam such as argon (Ar), xenon (Xe) or the like, which is chemically inactive or inert, is used.

When an insulating material such as ceramic or the like is used as a material for the shutter, the sputtering yield is low in order of $Al_2O_3$, SiC, $SiO_2$, etc. Therefore, the material can be selected by reference to such a characteristic.

In the present embodiment, the large-diameter portion 16A is formed in the part of the vacuum vessel to hold the shutter 82 therein when not in use. However, the overall diameter of the vacuum vessel of the dry etching apparatus may be increased so that the shutter 82 can be moved. When, however, the overall diameter is made large in this way, there is no inconvenience so long as the dry etching apparatus continues operating. When, on the other hand, vacuum evacuation is made upon maintenance, for example, there is produced a demerit that the time required to effect the vacuum evacuation is made long because the capacity of the vacuum vessel is large. It is therefore reasonable to partially provide the large-diameter portion 16A as illustrated in FIG. 26.

Figure 28:
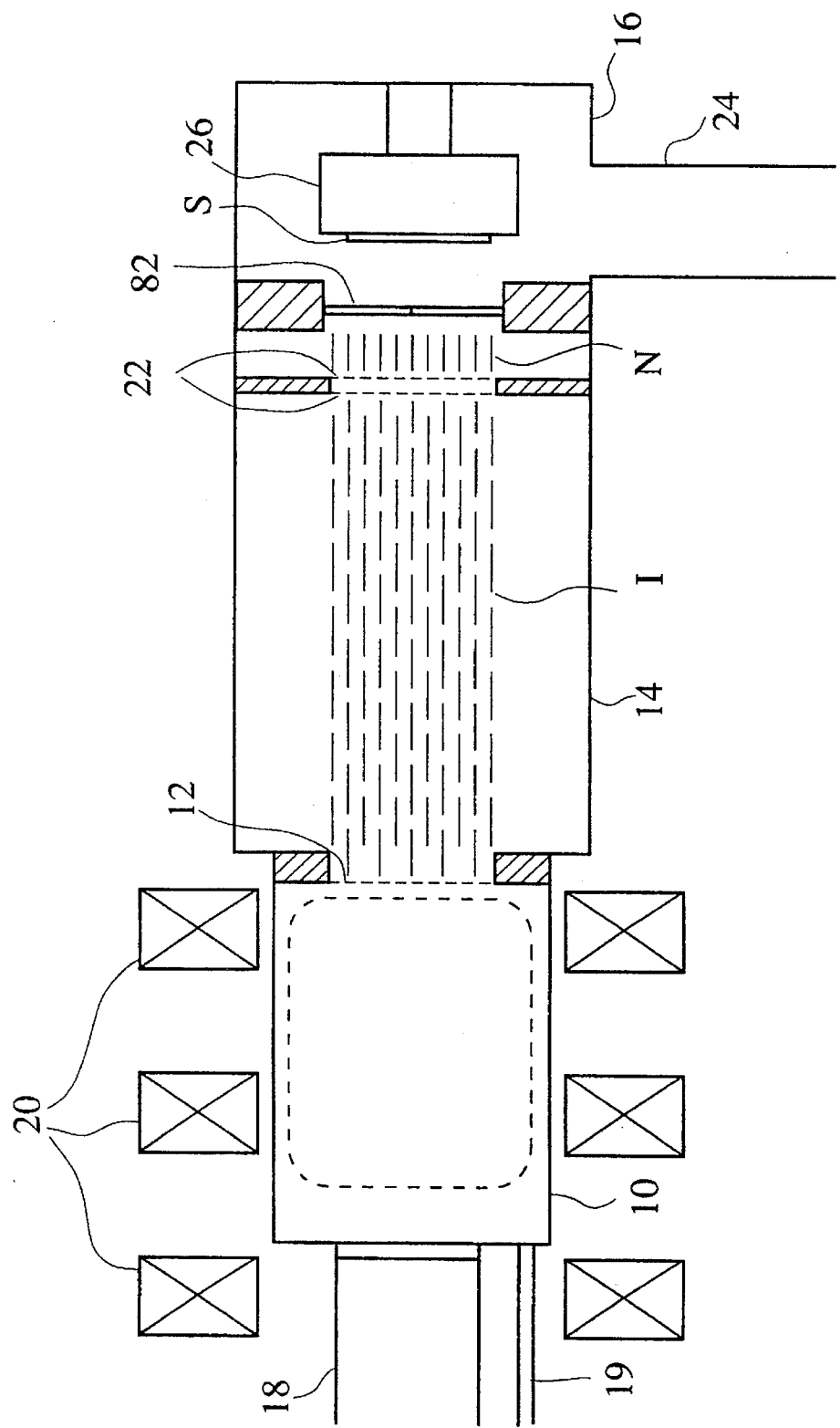
FIG. 28 is a cross-sectional view schematically showing a dry etching apparatus according to a twelfth embodiment of the present invention.

FIG. 28 is a schematic cross-sectional view showing a dry etching apparatus according to a twelfth embodiment of the present invention and corresponding to FIG. 26.

The dry etching apparatus according to the present embodiment is substantially identical in structure to that according to the eleventh embodiment except that a camera-type shutter is used as the shutter 82.

Figure 29A:
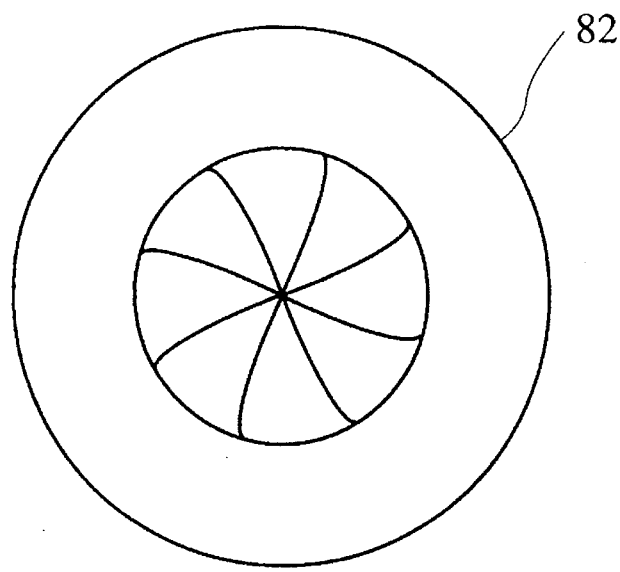
FIG. 29(A) and 29(B) are plan view illustrating, in enlarged form, a shutter employed in the dry etching apparatus shown in FIG. 28.
Figure 29B:
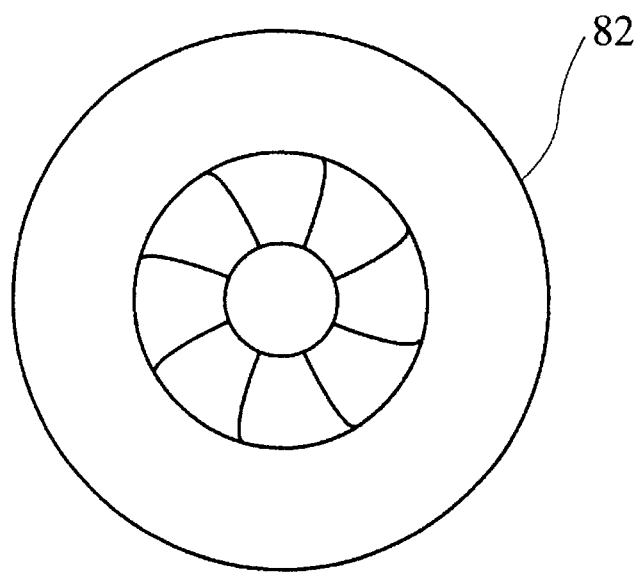
Figure 30:
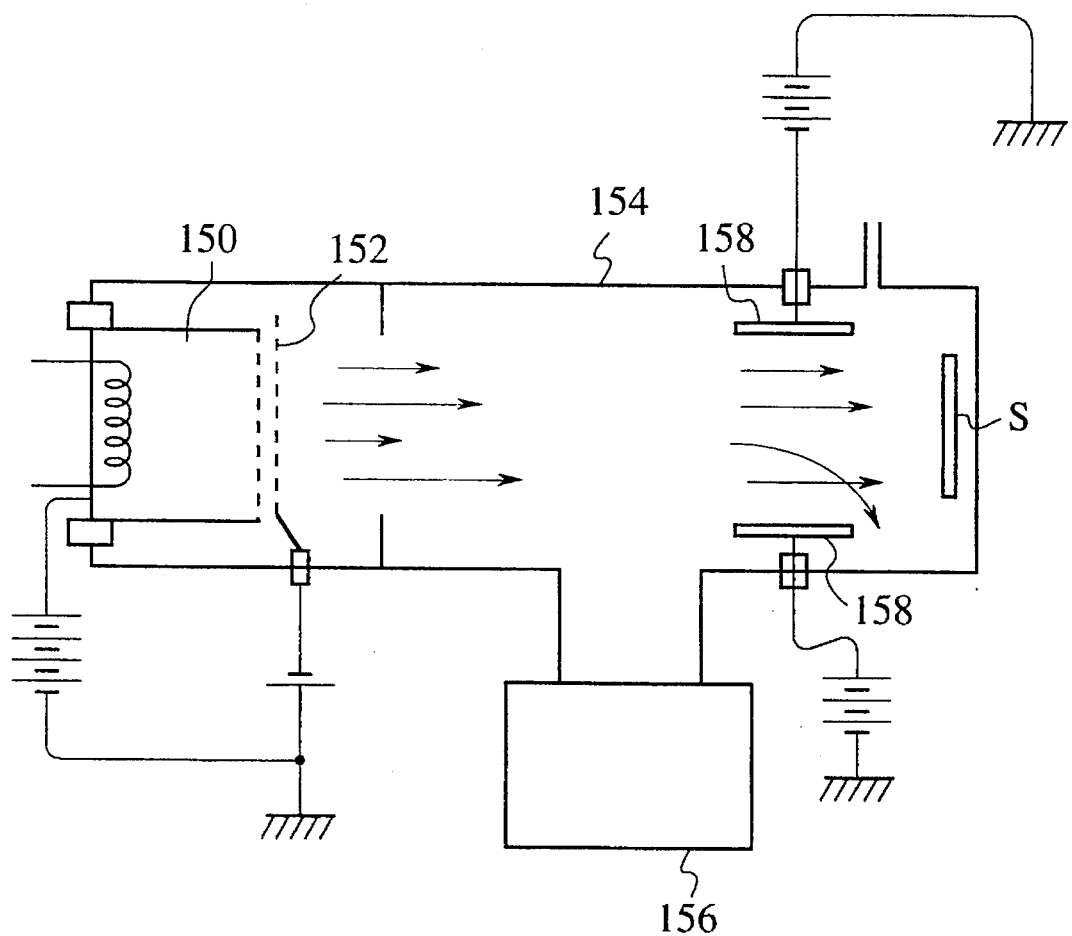
FIG. 30 is a cross-sectional view schematically illustrating one example of a conventional neutral-beam etching apparatus.

FIGS. 29(A) and 29(B) are plan views showing the lens shutter of camera-type shutter 82 in enlarged form. FIG. 29(A) shows the manner of closing of the shutter 82 and FIG. 29(B) illustrates the manner of semi-opening of the shutter 82.

In the present embodiment, the camera-type shutter 82 is made of carbon. It is however needless to say that other materials may be used as an alternative to the material for the formation of the shutter 82 in accordance with the standard which has been described in the eleventh embodiment.

According to the present embodiment, since the camera-type shutter 82 is used to cut off or block the neutral beam, stable and uniform processing can be effected on a substrate S for each processing in a manner similar to the eleventh embodiment. It is also unnecessary to provide the large-diameter portion 16A shown in FIG. 26 as the space for moving the shutter 82. Therefore, the dry etching apparatus can be fabricated in the form of a simple structure merely formed as a cylinder, for example. As a result, the dry etching apparatus can be manufactured with ease and at low cost.

The present invention has been described specifically by the above embodiments. However, the present invention is not necessarily limited to the aforementioned embodiments. Many changes and modifications can be made without departing from the subject matter.

For example, the above embodiments show the case where the static electric field lens and the magnetostatic field lens are respectively separately used as the lenses for preventing the ion beam from diverging. However, both lenses may be used in combination. A specific shape of the magnetostatic field lens is not necessarily limited to the shapes employed in the aforementioned embodiments.

Further, the above-described embodiment describes the case where the holder is provided with the function for cooling the object to be processed. The present embodiment is not necessarily limited to this function. There is sometimes a situation in which the object to be processed may be as well to be set to a high temperature to activate the radical reaction. In order to meet this condition, a heating function is applied to the holder by inserting a heating element such as SiC into the holder.

The energy for generating the plasma in the plasma chamber is not necessarily limited to the microwave. Desired energy for bringing gas into plasma, such as a radio wave, a d.c. electric field or the like may be used.

The dry etching apparatus for bringing the ion beam into alignment using either the static electric field lens or the magnetostatic field lens as has been described in each of the first through fifth embodiments may be constructed in such a manner that the holder 26 is moved (rotated, eccentrically rotated or linearly moved) in the direction parallel to the processing surface of the substrate S as has been described in each of the sixth through eighth embodiments (see FIGS. 17 through 20). Further, the above-described dry etching apparatus may be constructed in such a way that the spaced distance between the holder and the ion retarding electrodes 22 can be adjusted as has been described in the ninth embodiment (see FIG. 21). Furthermore, the ion retarding electrodes 22 may be rotated or eccentrically rotated as has been described in the tenth embodiment (see FIGS. 23 through 25).

The holder 26 may be rotated in parallel to the processing surface of the substrate S and activated in the direction orthogonal to the processing surface thereof. Further, for example, the operation of rotation of the ion retarding electrodes 22 may be carried out as well as the operation of the holder 26 in the vertical direction.

In addition, the ion retarding electrodes or the collimator may be linearly displaced.

The aforementioned embodiment describes the case where the collimator is made up of the two ion retarding electrodes. However, this embodiment is not necessarily limited to this construction.

The velocity control electrode 32 for controlling the speed or velocity of the ion beam and/or the exciting device 34 for exciting the neutral beam may be provided in each of the dry etching apparatuses according to the sixth through twelfth embodiments (see FIGS. 17 through 26 and FIG. 28, for example).

One shutter has been provided in the aforementioned embodiments. However, two or more shutters may be provided side by side.

The surface processing apparatus is not necessarily limited to each of the dry etching apparatuses described above and may be a sputtering apparatus or a film forming apparatus, for example.

In the aforementioned embodiments, the substrate S is positioned so that surface of the substrate S is essentially perpendicular to beam axis (Z axis) direction. However, positional relationship between the surface of the substrate S and the beam axis is not limited to the above perpendicular relation, but can be shifted to out of perpendicular relation so as to perform special work.

What is claimed is:

1. An apparatus for irradiating a surface of an object to be processed with a neutral beam, said object attached to a holder, said apparatus comprising:

converting means for converting an ion beam extracted from a plasma into the neutral beam; and one of mesh-shaped ion retarding electrodes or a collimator allowing said neutral beam to pass and irradiate the object to be processed, said one of the mesh-shaped ion retarding electrodes or said collimator movable in a direction almost perpendicular to a beam axis direction.

2. An apparatus according to claim 1, wherein said holder is movable in at least one of a direction parallel to the surface of said object and a direction orthogonal to the surface of said object.

3. An apparatus for irradiating a surface of an object to be processed with a neutral beam, said object attached to a holder, said apparatus comprising:

converting means for converting an ion beam extracted from a plasma into the neutral beam;

an ion removal electrode allowing said neutral beam to pass and irradiate the object attached to the holder; and a shutter for blocking said neutral beam, said shutter disposed between said ion removal electrode and said holder.

4. An apparatus according to claim 2, wherein the movement of said holder in the direction parallel to the surface of said object is at least one of coaxial rotation, eccentric rotation and linear movement.

5. An apparatus according to claims 1, wherein the movement of said one of said mesh-shaped ion retarding electrodes or said collimator is at least one of coaxial rotation, eccentric rotation and linear movement.

6. An apparatus according to claim 1, wherein said holder is movable in a direction parallel to the surface of said object.

* * * * *